United States Patent [19]
Tsujino et al.

[11] Patent Number: 5,841,164
[45] Date of Patent: Nov. 24, 1998

[54] TEST STRUCTURE FOR DIELECTRIC FILM EVALUATION

[75] Inventors: Mitsunori Tsujino; Mikihiro Kimura, both of Tokyo, Japan

[73] Assignee: Mitsubishi Denki Kabushiki Kaisha, Tokyo, Japan

[21] Appl. No.: 630,454

[22] Filed: Apr. 10, 1996

[30] Foreign Application Priority Data

Oct. 30, 1995 [JP] Japan .................................. 7-281223

[51] Int. Cl.⁶ .................. H01L 29/788; H01L 29/76; H01L 29/94; H01L 31/062
[52] U.S. Cl. ........................................ 257/316; 257/369
[58] Field of Search .................. 257/204, 309, 257/316, 369

[56] References Cited

U.S. PATENT DOCUMENTS

| | | | |
|---|---|---|---|
| 4,753,898 | 6/1988 | Parrillo et al. | 257/369 |
| 5,250,823 | 10/1993 | Veendrick et al. | 257/369 |
| 5,466,956 | 11/1995 | Aeba | 257/48 |
| 5,543,633 | 8/1996 | Losavio et al. | 257/48 |
| 5,638,003 | 6/1997 | Hall | 324/514 |

*Primary Examiner*—Stephen Meier
*Attorney, Agent, or Firm*—Oblon, Spivak, McClelland, Maier & Neustadt, P.C.

[57] ABSTRACT

It is an object to obtain evaluation results with a dielectric film evaluating test structure which are close to those with an actual device. Gate electrodes (6A) are provided in a dielectric film evaluating test structure. In the gate electrodes 6A, openings (20) are formed on a gate insulator film (5) by etching, or the like.

18 Claims, 22 Drawing Sheets

FIG. 37
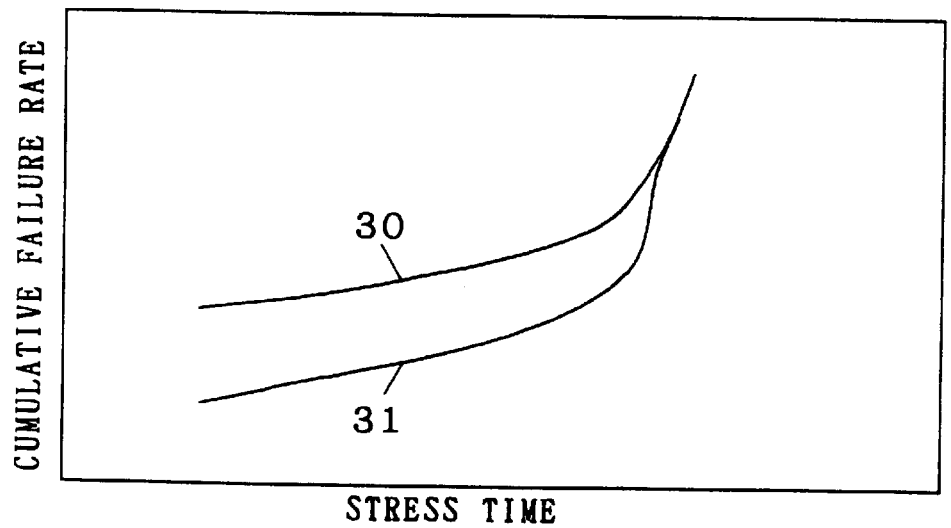
FIG. 38a
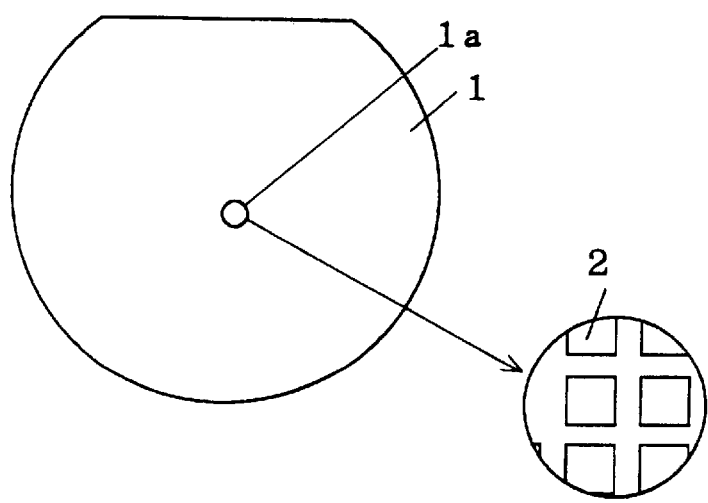
FIG. 38b

TEST STRUCTURE FOR DIELECTRIC FILM EVALUATION

BACKGROUND OF THE INVENTION

1. Field of the invention

The present invention relates to a test structure for evaluating characteristics of dielectric films, and relates to a novel test structure for dielectric film evaluation for evaluating the breakdown voltage ($V_{BD}$), the time dependent dielectric breakdown (TDDB), the current-voltage (I-V) characteristic, the capacitance-voltage (C-V) characteristic, etc. of the dielectric film with a structure close to an actual device.

2. Description of the Background Art

FIG. 38 is a plan view showing a semiconductor wafer as an example of an object of the dielectric film evaluation. The part 1a of the semiconductor wafer 1 is shown being enlarged in the right bottom corner in FIG. 38. As can be seen from this enlarged view, a large number of elements 2 are formed in this semiconductor wafer 1.

The element 2 conventionally has a dielectric film evaluating test structure shown in FIG. 39 and FIG. 40. FIG. 39 is a plan view showing the conventional dielectric film evaluating test structure and FIG. 40 is a sectional view taken along the line X—X in FIG. 39. In FIG. 39 and FIG. 40, reference numeral 3 denotes a semiconductor substrate such as a wafer, 4 denotes a field oxide film formed on one main surface 3a of the semiconductor substrate 3, 5 denotes a dielectric film formed on the one main surface 3a surrounded with the field oxide film 4, and 6 denotes a gate electrode formed on the dielectric film 5 and a part of the field oxide film 4.

The semiconductor substrate 3, the dielectric film 5 and the gate electrode 6 form a planar capacitor. To cause it to work as a capacitor, a voltage is applied between the other main surface 3b of the semiconductor substrate 3 and the gate insulator film 6.

Next, the method of evaluating the dielectric film will be described. FIG. 41 is a conceptional view of a device for performing the breakdown voltage, I-V characteristic, and TDDB tests. In FIG. 41, reference numeral 40 denotes a semiconductor substrate or a corresponding portion, 41 denotes a dielectric film formed on the semiconductor substrate 40, 42 denotes an electrode formed on the dielectric film 41, 43 denotes a DC power-supply for applying a voltage between the semiconductor substrate 40 and the electrode 42, 44 denotes a voltmeter connected to both ends of the DC power-supply 43 for measuring the output voltage of the DC power-supply 43, and 45 denotes an ammeter interposed in the current path through which the DC power-supply 43 supplies voltage for measuring the current flowing between the electrode 42 and the semiconductor substrate 40.

Actually, the semiconductor substrate 40 is the wafer 1 shown in FIG. 38 and the electrode 42 is the electrode provided in the plurality of elements 2 on the wafer 1.

FIG. 42 is a graph showing an example of results of the I-V characteristic test and the breakdown voltage test. The axis of abscissas of the graph represents the electric field strength $E_{ox}$ in the dielectric film on a uniform scale and the axis of ordinates of the graph represents the gate current density $J_G$ on a log scale. The breakdown voltage depends on the film thickness of the dielectric film, and if the electric field strength at which the breakdown occurs is taken as Eb and the film thickness of the dielectric film is taken as tb, the withstanding voltage is represented as Eb×tb. In FIG. 42, reference numeral 50 is a curve indicating the measured results about the dielectric film after stress is applied, and 51 is a curve indicating the measured results about the dielectric film when no stress is applied.

FIG. 43 is a graph showing an example of results of the TDDB test. In FIG. 43, the axis of ordinates shows the cumulative failure rate, and the axis of abscissas shows the stress time. In the TDDB test, a voltage value when stress is applied and a voltage value when measuring are respectively determined, and elements are determined to be defective when a certain current is exceeded with the measurement voltage applied. (CVS measurement; Constant Voltage Stress measurement) It is observed what percent of the elements in the wafer are determined to be defective in time.

FIG. 44 is a graph showing an example of results of the C-V characteristic test of an MOS capacitor. In the graph, the axis of ordinates shows the capacitance $C/C_0$ standardized with fixed capacitance and the axis of abscissas shows the gate voltage $V_G$. In FIG. 44, reference numeral 55 is a curve showing the measured results when the frequency of the AC voltage applied in measurement is 10 Hz, 56 is a curve showing the measured results when the frequency of the AC voltage is 100 Hz, and 57 is a curve showing the measured results when the frequency of the AC voltage is 10 KHz.

The conventional dielectric film evaluating test structure structured as shown in FIG. 39 and FIG. 40 is different from an actual device structure in that it has no etching process of the gate electrode, has no well in the surface of the semiconductor substrate 3 and no implantation layers such as source, drain, for example. Hence, tests can not be performed taking into consideration the effects of damage caused to the dielectric in the actual process flow, such as the gate electrode etching damage, the ion implantation damage of the source, drain, and the effects on the semiconductor surface, the gate oxide film when a well is formed in the semiconductor substrate. Accordingly, large errors arise between the evaluation results of the above-mentioned characteristics obtained from the conventional dielectric film evaluating test structure and the characteristics obtained from an actual device.

Especially, recently, on the basis of the scaling law, the ion implantation concentration of the source, drain is increasing and the dielectric film thickness is decreasing to several tens Angstroms. Therefore, damages in the above-mentioned processes upon the dielectric film can not be disregarded, and accurate evaluation is difficult.

SUMMARY OF THE INVENTION

A first aspect of the present invention is directed to a dielectric film evaluating test structure which includes: a semiconductor substrate having one main surface and the other main surface; a field oxide film formed on the one main surface of the semiconductor substrate to surround at least one first region on the one main surface; a dielectric film formed in the at least one first region and having its end coupled with the field oxide film; and at least one gate electrode including an electrode material formed on the dielectric film; wherein the at least one gate electrode has its shape determined by a plurality of openings formed on the dielectric film by etching the electrode material and a source, drain region is not formed under a portion exposed in the plurality of openings in the dielectric film.

Preferably, the dielectric film evaluating test structure further includes a well formed in the semiconductor substrate under the dielectric film, the well having a well contact for applying a desired voltage between the at least one gate electrode and the well.

Preferably, in the dielectric film evaluating test structure, the well contact is eliminated.

Preferably, in the dielectric film evaluating test structure, the at least one first region includes a plurality of first regions, and the at least one gate electrode is formed over the plurality of first regions.

Preferably, in the dielectric film evaluating test structure, the at least one gate electrode includes a plurality of elongate gate electrodes formed being separated by the plurality of openings on the dielectric film.

Preferably, in the dielectric film evaluating test structure, the at least one first region includes a plurality of first regions, and the at least one gate electrode is formed over the plurality of first regions.

Preferably, the dielectric film evaluating test structure further includes a well formed in the semiconductor substrate under the dielectric film, the well having a well contact for applying a desired voltage between the at least one gate electrode and the well.

Preferably, in the dielectric film evaluating test structure, the well contact is eliminated.

A second aspect of the present invention is directed to a dielectric film evaluating test structure which includes: a semiconductor substrate having one main surface and the other main surface; a field oxide film formed on the one main surface of the semiconductor substrate to surround at least one first region on the one main surface; a dielectric film formed in the at least one first region and having its end coupled with the field oxide film; a plurality of gate electrodes including an electrode material provided on the dielectric film and having its shape determined by a plurality of openings formed by etching the electrode material; and a source, drain region formed under a portion of the dielectric film exposed in the plurality of openings by driving impurities through the dielectric film.

Preferably, in the dielectric film evaluating test structure, the at least one first region includes a plurality of first regions, and the plurality of gate electrodes are formed over the plurality of first regions.

Preferably, the dielectric film evaluating test structure further includes a well formed in the semiconductor substrate under the dielectric film, the well having a well contact for applying a desired voltage between the plurality of gate electrodes and the well.

Preferably, in the dielectric film evaluating test structure, the at least one first region includes a plurality of first regions, and the plurality of gate electrodes are formed over the plurality of first regions.

Preferably, in the dielectric film evaluating test structure, the well contact is eliminated.

Preferably, the dielectric film evaluating test structure further includes a source, drain contact formed in the source, drain region for applying a certain voltage between the source, drain region and the semiconductor substrate.

Preferably, in the dielectric film evaluating test structure, the at least one first region includes a plurality of first regions, and the plurality of gate electrodes are formed over the plurality of first regions.

Preferably, the dielectric film evaluating test structure further includes a well formed in the semiconductor substrate under the dielectric film, the well having a well contact for applying a desired voltage between the plurality of gate electrodes and the well.

Preferably, in the dielectric film evaluating test structure, the at least one first region includes a plurality of first regions, and the plurality of gate electrodes are formed over the plurality of first regions.

Preferably, in the dielectric film evaluating test structure, the well contact is eliminated.

Preferably, in the dielectric film evaluating test structure, the source, drain region has no contact and has the same conductivity type as that of the semiconductor substrate.

Preferably, in the dielectric film evaluating test structure, the plurality of first region includes a plurality of first regions, and the plurality of gate electrodes are formed over the plurality of first regions.

The present invention has been made to solve such problems as described before, and it is an object to provide a dielectric film evaluating test structure which can more accurately obtain the above-mentioned characteristic evaluations of a dielectric film, enabling application evaluation.

These and other objects, features, aspects and advantages of the present invention will become more apparent from the following detailed description of the present invention when taken in conjunction with the accompanying drawings.

BRIEF DESCRIPTION OF THE DRAWINGS

FIG. 37 is a graph showing the results of TDDB tests using the dielectric film evaluating test structure of the fourteenth preferred embodiment of the present invention and a conventional dielectric film evaluating test structure.

FIG. 38 is a plan view showing a semiconductor wafer as an example of an object of dielectric film evaluation.

DESCRIPTION OF THE PREFERRED EMBODIMENTS

First Preferred Embodiment.

Figure 1:
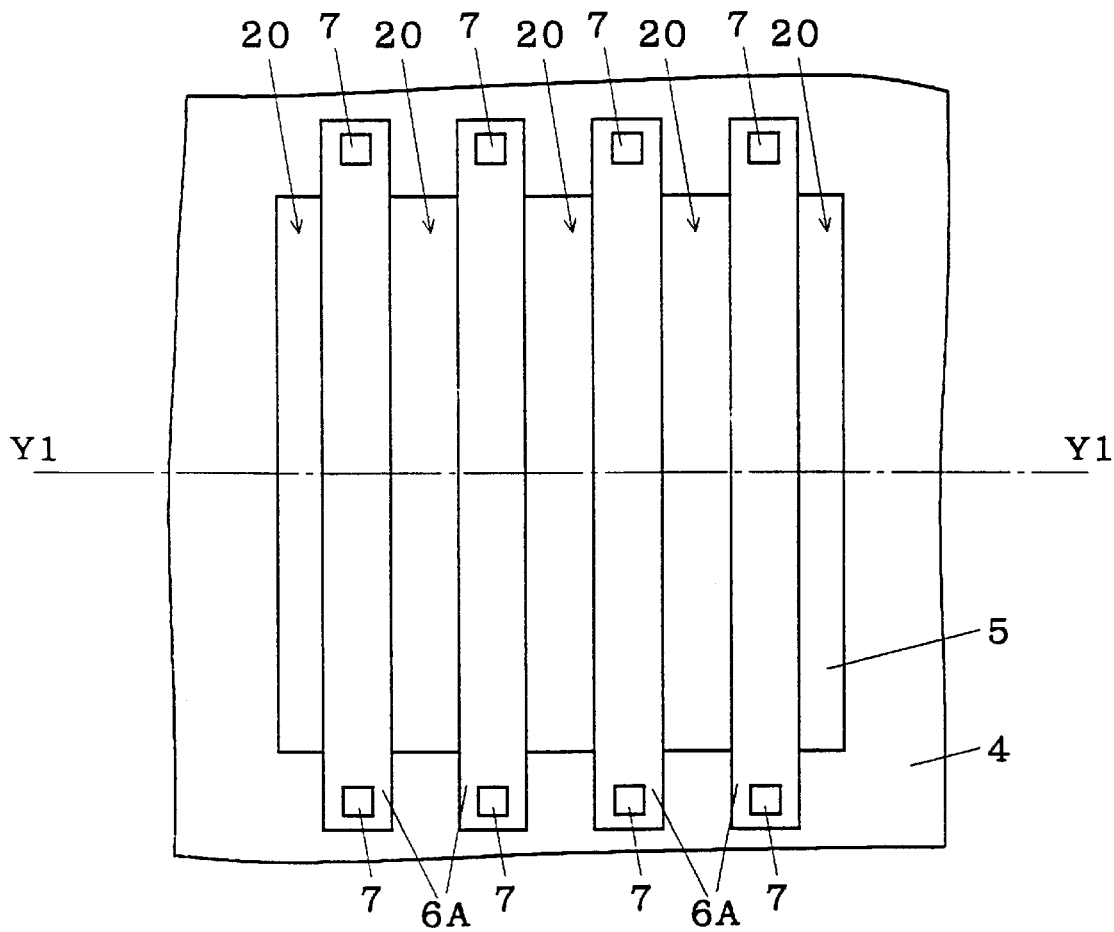
FIG. 1 is a plan view showing the structure of a dielectric film evaluating test structure according to a first preferred embodiment of the present invention.
Figure 2:
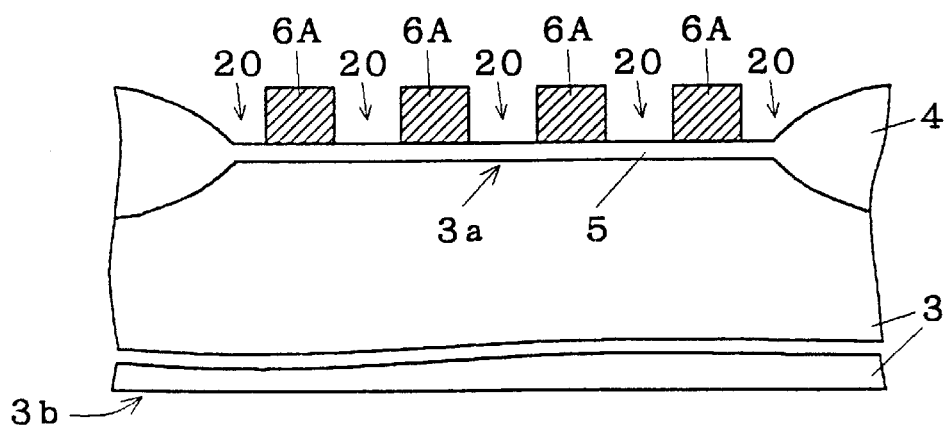
FIG. 2 is a sectional view taken along the line Y1—Y1 in FIG. 1.

FIG. 1 and FIG. 2 are diagrams showing a dielectric film evaluating test structure according to a first preferred embodiment of the present invention. FIG. 1 is a plan view of the dielectric film evaluating test structure of the first preferred embodiment and FIG. 2 is a sectional view taken along the line Y1—Y1 in FIG. 1. In FIG. 1 and FIG. 2, reference numeral 3 denotes a semiconductor substrate such as a wafer, 4 denotes a field oxide film formed on one main surface 3a of the semiconductor substrate 3, 5 denotes a gate insulator film formed on the one main surface 3a surrounded by the field oxide film 4, 6A denotes a plurality of gate electrodes formed on the gate insulator film (dielectric film) 5 by the gate electrode etching process with a channel length shorter than the channel width, 7 denotes contacts for making electric connection with the gate electrodes 6A, and 20 denotes openings formed when the electrode member is removed to form the gate electrodes 6A by the gate electrode etching process.

When a test is performed, in the dielectric film evaluating test structure shown in FIG. 1 and FIG. 2, all of the contacts of the four gate electrodes 6A are connected in common and the same voltage is applied to all of the four gate electrodes 6A. Since the plurality of gate electrodes 6A are connected in common, the evaluation of the dielectric film can be made with a large area, so that the effects of external factors, such as the process damage etc. can be large.

In the above preferred embodiment, when characteristic evaluation is applied to the dielectric film 5, as the structure of the gate electrodes 6A is manufactured using the gate etching process, the effects of the etching damage upon the dielectric film (the gate electrode 5) in the gate electrode etching process in an actual device can be correctly evaluated.

The contacts 7 for connecting the plurality of gate electrodes 6A in common are provided on the field oxide film 4. This structure can avoid the problem that the gate contact margin disappears because the gate length (channel length) becomes shorter with higher integration and higher performance. Furthermore, this structure lessens the effects of contaminations of the wiring material etc. upon the dielectric film.

Second Preferred Embodiment.

Figure 3:
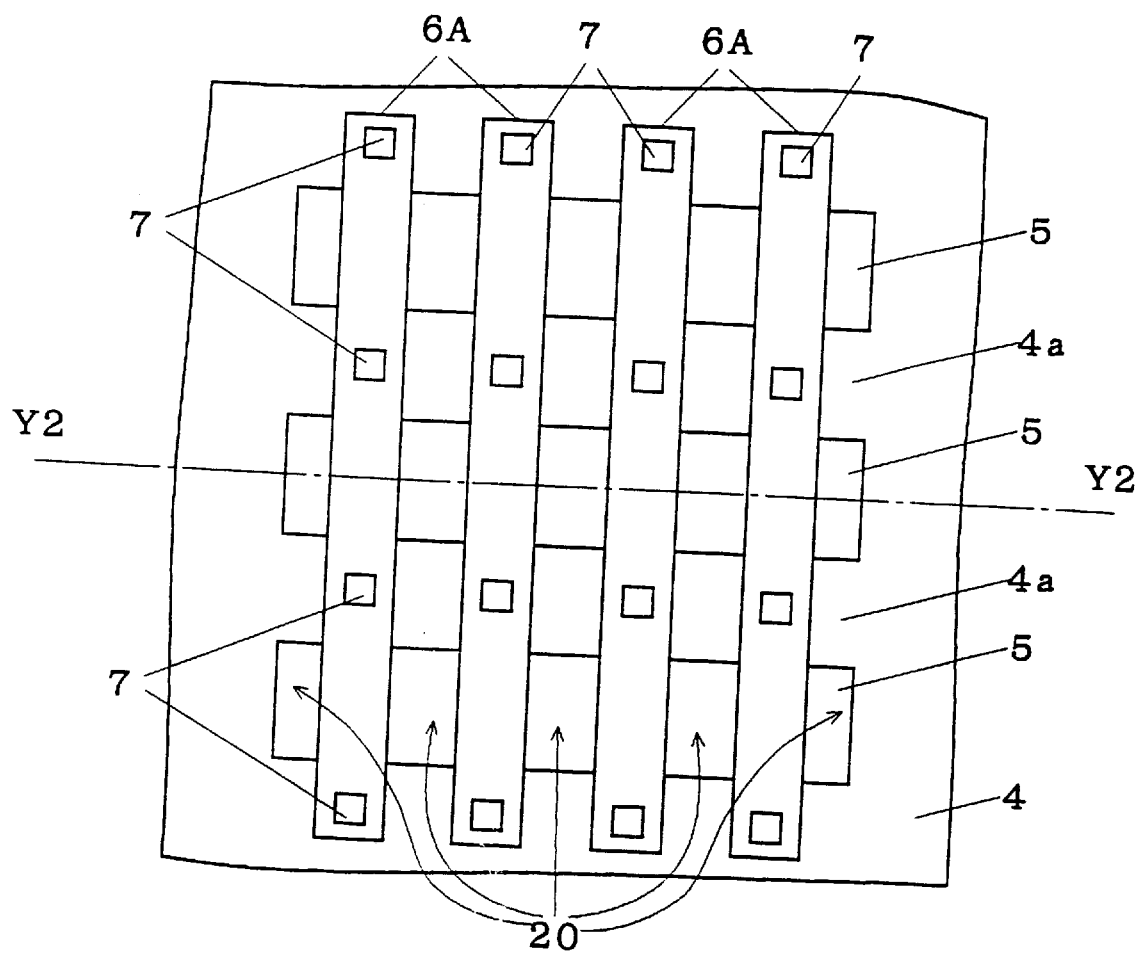
FIG. 3 is a plan view showing the structure of a dielectric film evaluating test structure according to a second preferred embodiment of the present invention.
Figure 4:
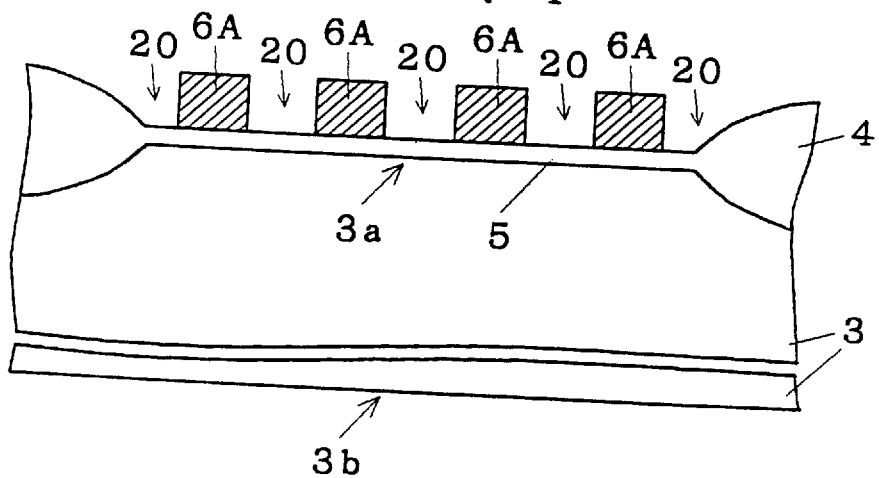
FIG. 4 is a sectional view taken along the line Y2—Y2 in FIG. 3.

FIG. 3 and FIG. 4 are diagrams showing a dielectric film evaluating test structure according to a second preferred embodiment of the resent invention. FIG. 3 is a plan view of the dielectric film evaluating test structure of the second preferred embodiment and FIG. 4 is a sectional view taken along the line Y2—Y2 of FIG. 3. In FIG. 3 and FIG. 4, reference numeral 4a denotes a field oxide film formed between the plurality of gate insulator films 5, and other parts shown by the same reference characters as those in FIG. 1 or FIG. 2 are the same or corresponding parts as or to those shown by the same reference characters in. FIG. 1 or FIG. 2.

The dielectric film evaluating test structure shown in FIG. 3 is different from the dielectric film evaluating test structure shown in FIG. 1 in that the dielectric films (gate insulator films 5) are formed in a plurality of regions surrounded by the field oxide film 4. Accordingly, the length of the overlap of the gate electrodes 6A and the boundaries between the gate insulator films 5 and the field oxide film 4 per one evaluating test structure for the dielectric film is longer than that in the dielectric film evaluating test structure shown in FIG. 1. Accordingly, the effects of the boundary between the field oxide film 4 and the gate insulator films 5 can be clarified, increasing the accuracy in evaluating the effects of the boundary. That is to say, the dielectric film evaluation can be made considering the effects upon the dielectric film caused by defects due to edges of the field oxide film 4, stress breaking occurring in the edge of the field oxide film 4, and the like, which means that evaluation is close to that of an actual device.

Third Preferred Embodiment.

Figure 5:
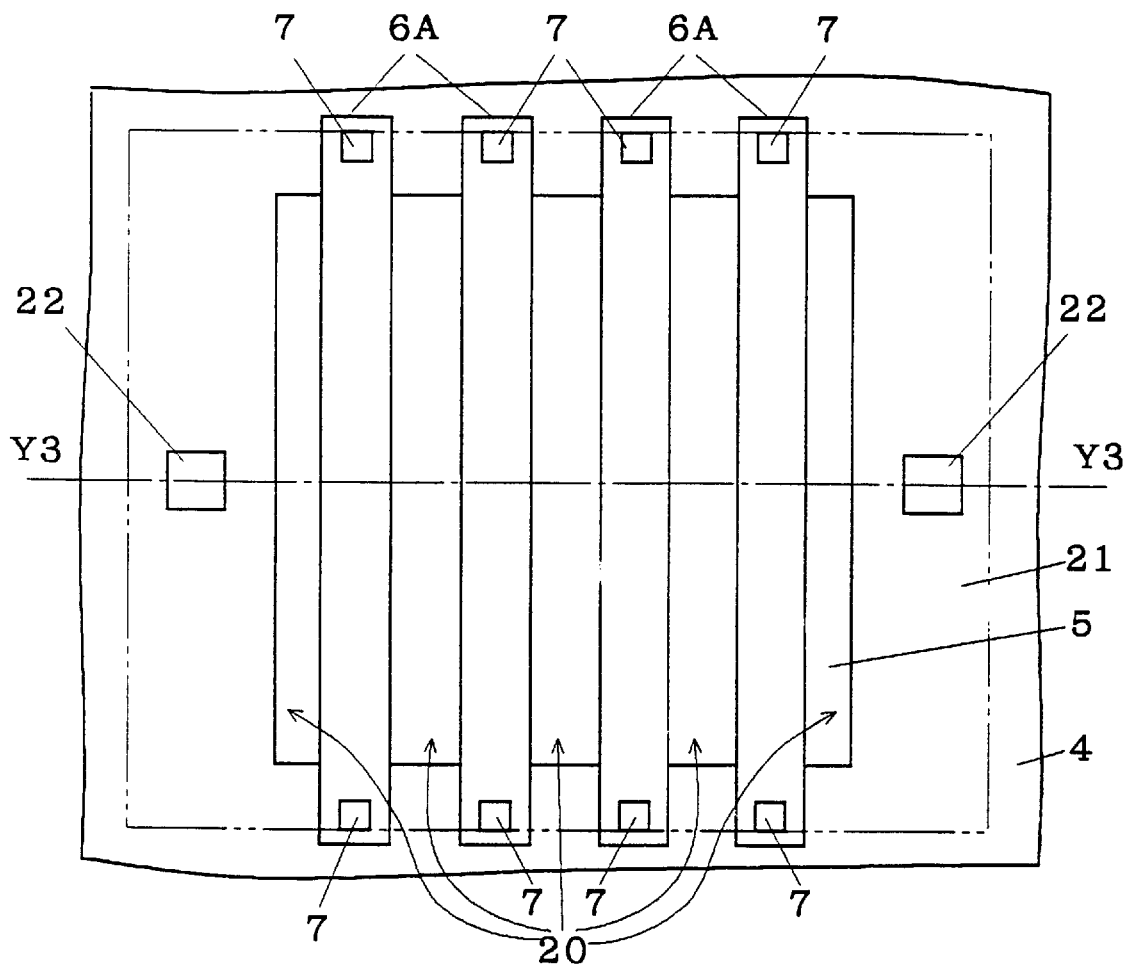
FIG. 5 is a plan view showing the structure of a dielectric film evaluating test structure according to a third preferred embodiment of the present invention.
Figure 6:
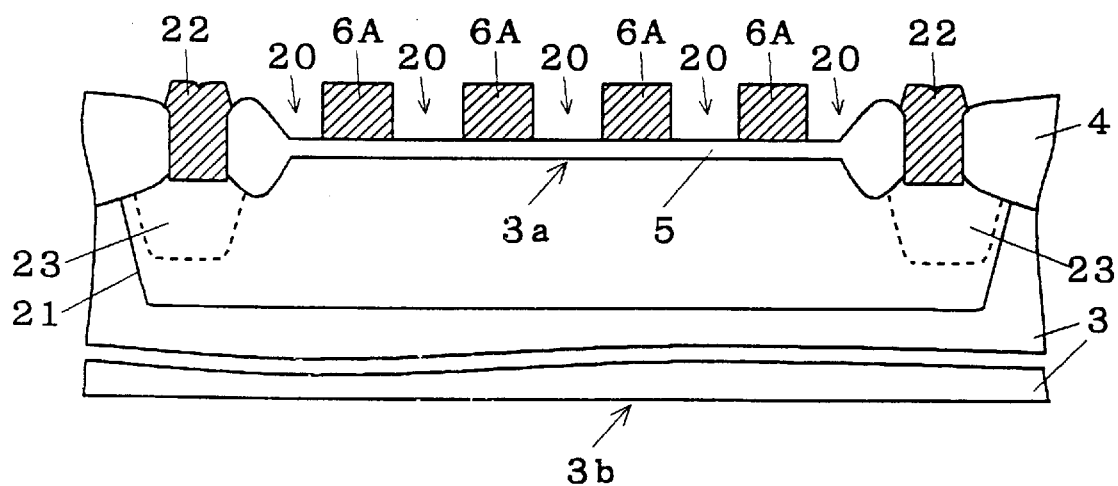
FIG. 6 is a sectional view taken along the line Y3—Y3 in FIG. 5.

FIG. 5 and FIG. 6 are diagrams showing a dielectric film evaluating test structure according to a third preferred embodiment of the present invention. FIG. 5 is a plan view of the dielectric film evaluating test structure of the third preferred embodiment and FIG. 6 is a sectional view taken along the line Y3—Y3 of FIG. 5. In FIG. 5 and FIG. 6, reference numeral 21 denotes a well formed in the one main surface 3a of the semiconductor substrate 3 under the gate insulator film 5, 22 denotes well contacts for applying a desired voltage between the well 21 and the gate electrodes 6A, 23 denotes semiconductor regions formed for good connection between the well 21 and the well contacts 22 and having impurity concentration higher than that of the well 21, and other parts shown by the same reference characters as those in FIG. 1 or FIG. 2 are parts the same as or corresponding to the parts shown by the same reference characters in FIG. 1 or FIG. 2.

The test structure shown in FIG. 5 and FIG. 6 is characterized in that the well 21 is formed in the one main surface 3a of the semiconductor substrate 3, which is not formed in the test structure of the first preferred embodiment shown in FIG. 1.

The effects obtained by using the dielectric film evaluating test structure shown in FIG. 5 and FIG. 6 include evaluation considering the effects caused by formation of the well 21 upon the dielectric film. This structure also allows evaluation of a structure applied to a shallow well structure used for soft error measures. Furthermore, forming the elements 2 on the one wafer 1 shown in FIG. 38 into P type and N type using mask and using two elements with different conductivity types allows evaluation of a CMOS structure.

Fourth Preferred Embodiment.

Figure 7:
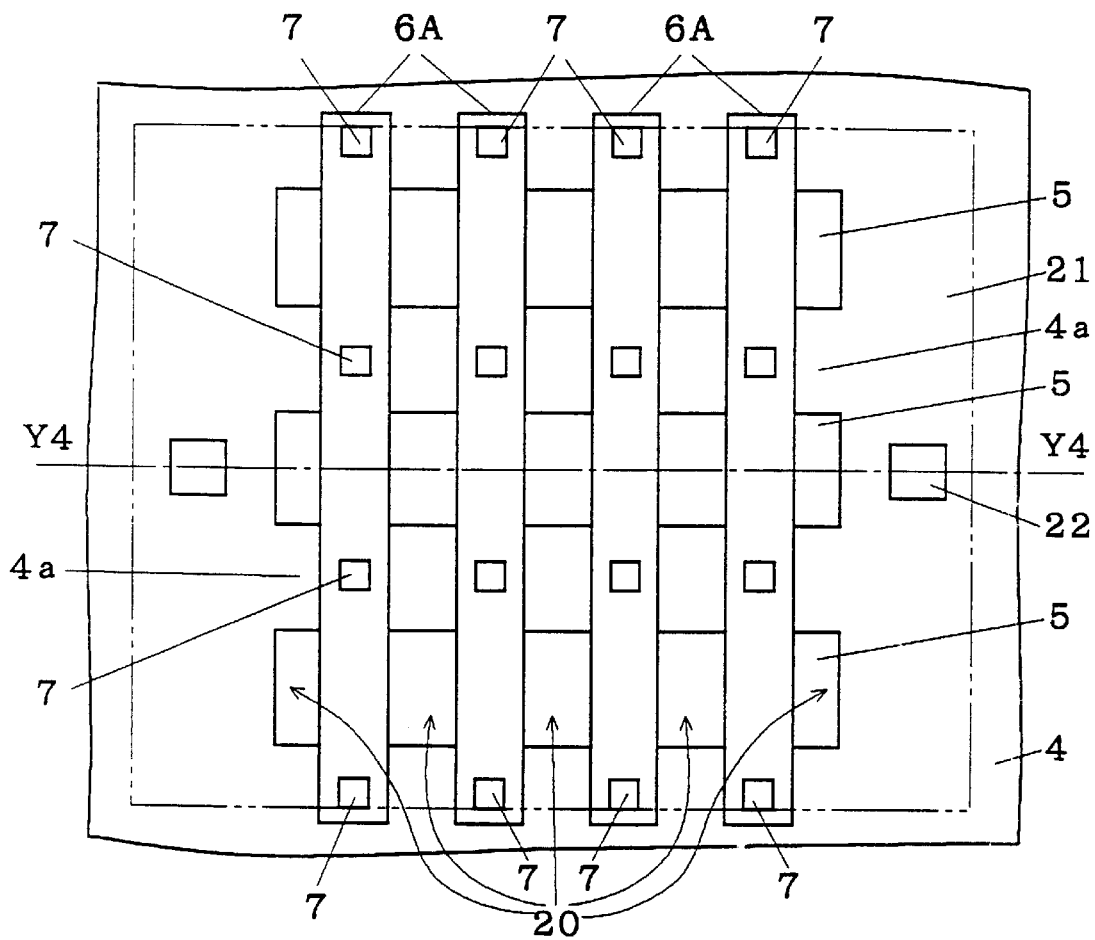
FIG. 7 is a plan view showing the structure of a dielectric film evaluating test structure according to a fourth preferred embodiment of the present invention.
Figure 8:
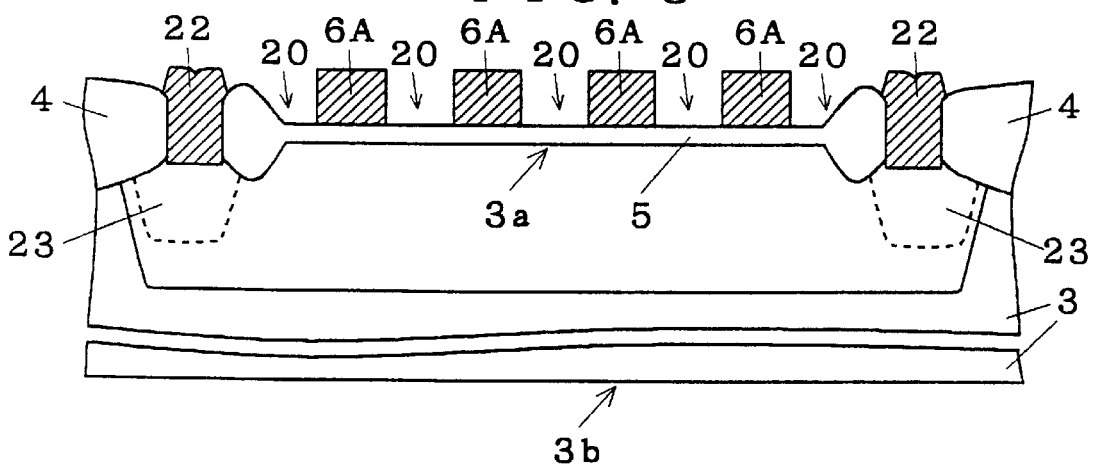
FIG. 8 is a sectional view taken along the line Y4—Y4 in FIG. 7.

FIG. 7 and FIG. 8 are diagrams showing the structure of a dielectric film evaluating test structure according to a fourth preferred embodiment of the present invention. FIG. 7 is a plan view of the dielectric film evaluating test structure of the fourth preferred embodiment and FIG. 8 is a sectional view taken along the line Y4—Y4 in FIG. 7. In FIG. 7 and FIG. 8, reference numeral 4a denotes a field oxide film formed between the plurality of dielectric films (gate insulator films 5), and other parts shown by the same reference characters as those in FIG. 5 or FIG. 6 are parts the same as or corresponding to those shown by the same reference characters in FIG. 5 or FIG. 6.

The dielectric film evaluating test structure shown in FIG. 7 and FIG. 8 is different from the dielectric film evaluating test structure shown in FIG. 5 in that the dielectric films (gate insulator films 5) are formed in a plurality of regions surrounded by the field oxide film 4. Accordingly, the length of overlap of the gate electrodes 6A and the boundaries between the gate insulator films 5 and the field oxide film 4 per one evaluating test structure for the dielectric films is longer than that in the dielectric film evaluating test structure shown in FIG. 5. Accordingly, the effects of the boundary between the field oxide film 4 and the gate insulator films 5 can be cleared up, increasing the accuracy in evaluating the effects of the boundary.

Fifth Preferred Embodiment.

Figure 9:
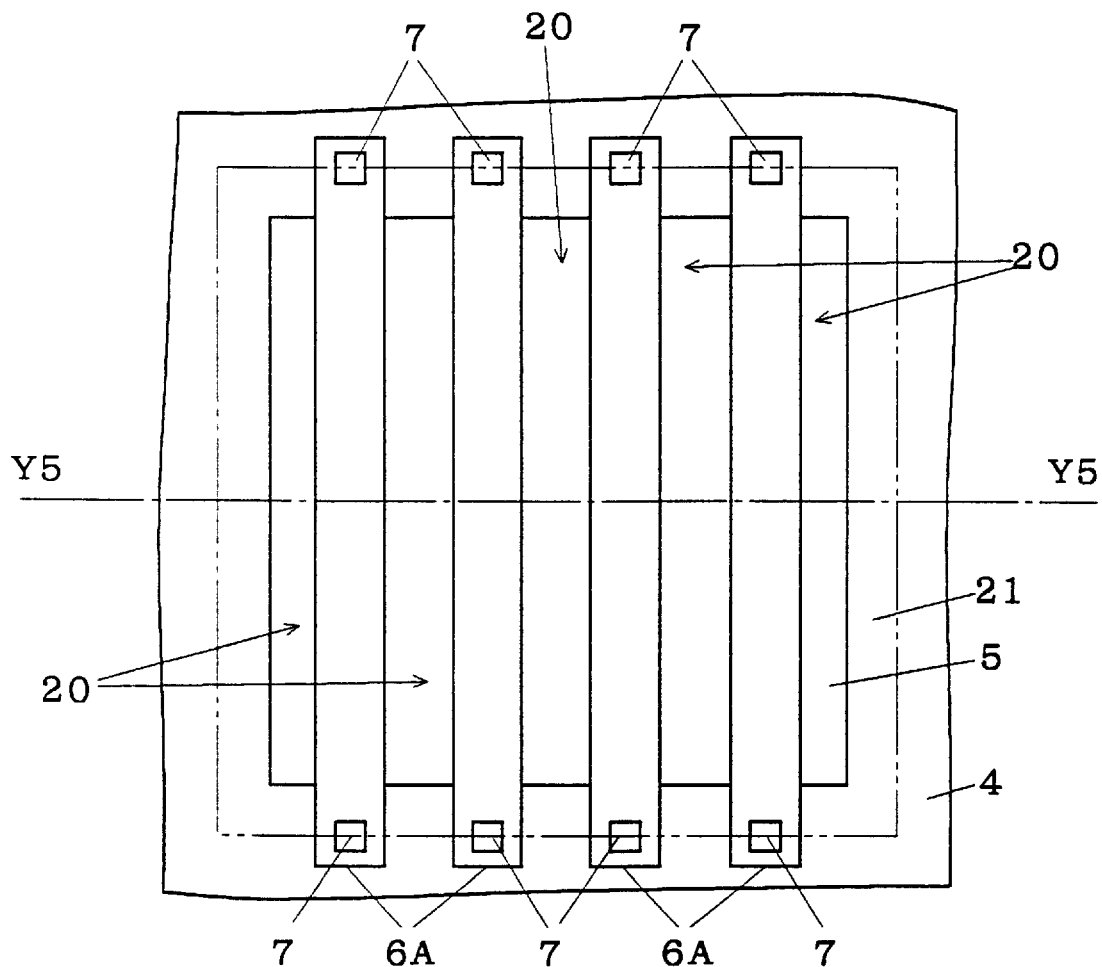
FIG. 9 is a plan view showing the structure of a dielectric film evaluating test structure according to a fifth preferred embodiment of the present invention.
Figure 10:
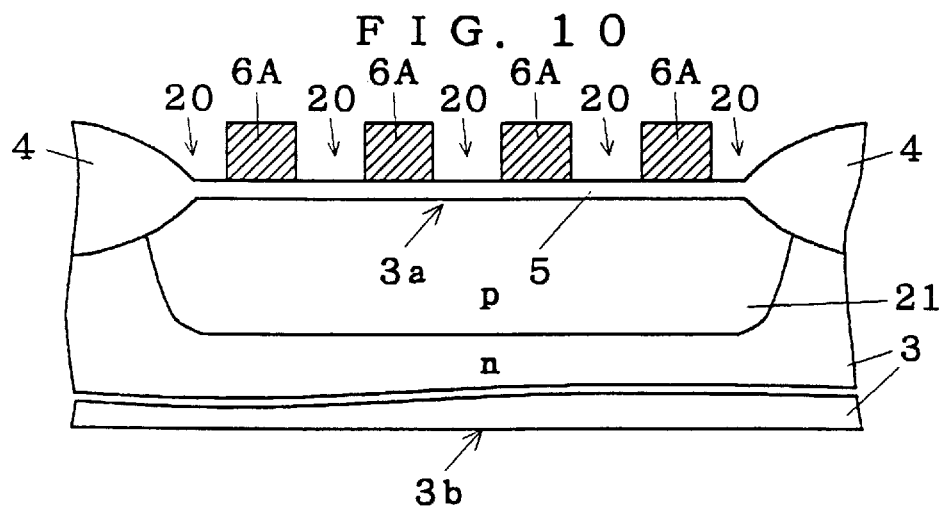
FIG. 10 is a sectional view taken along the line Y5—Y5 in FIG. 9.

FIG. 9 and FIG. 10 are diagrams showing the structure of a dielectric film evaluating test structure according to a fifth preferred embodiment of the present invention. FIG. 9 is a plan view of the dielectric film evaluating test structure of the fifth preferred embodiment and FIG. 10 is a sectional view taken along the line Y5—Y5 of FIG. 9. In FIG. 9 and FIG. 10, reference numeral 21 denotes a well formed in the one main surface 3a of the semiconductor substrate 3 under the gate insulator film 5, and other parts shown by the same reference characters as those in FIG. 1 or FIG. 2 are parts the same as or corresponding to the parts shown by the same reference characters in FIG. 1 or FIG. 2.

The test structure shown in FIG. 9 and FIG. 10 is characterized in that the well 21, which is not formed in the test structure of the first preferred embodiment shown in FIG. 1, is formed in the one main surface 3a of the semiconductor substrate 3. Accordingly, it has the same effects as those of the dielectric film evaluating test structure of the third preferred embodiment shown in FIG. 5 or FIG. 6.

Furthermore, since the dielectric film evaluating test structure shown in FIG. 9 and FIG. 10 does not have the well contacts 22 and the semiconductor regions 23 which are formed in the dielectric film evaluating test structure shown in FIG. 5 and FIG. 6, it has the effect that the simple structure facilitates manufacturing of the test structure. As a PN junction is made between the well 21 and the semiconductor substrate 3, however, correct evaluation is made only when the gate electrode 6A is with a higher voltage relative to the well 21, in which point the dielectric film evaluating test structure of the third preferred embodiment is superior in that the evaluation can be made both in the cases of a higher voltage and a lower voltage of the gate electrode 6A relative to the well 21.

Sixth Preferred Embodiment.

Figure 11:
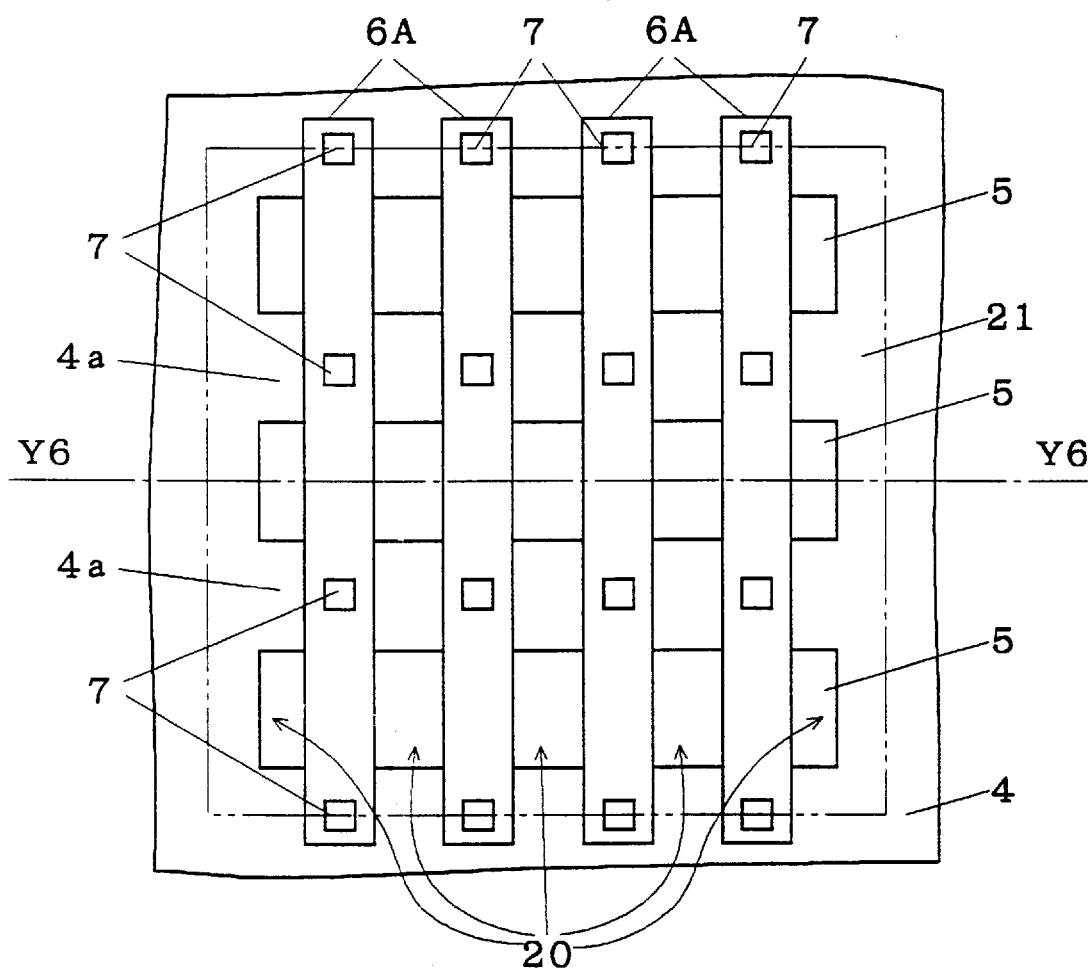
FIG. 11 is a plan view showing the structure of a dielectric film evaluating test structure according to a sixth preferred embodiment of the present invention.
Figure 12:
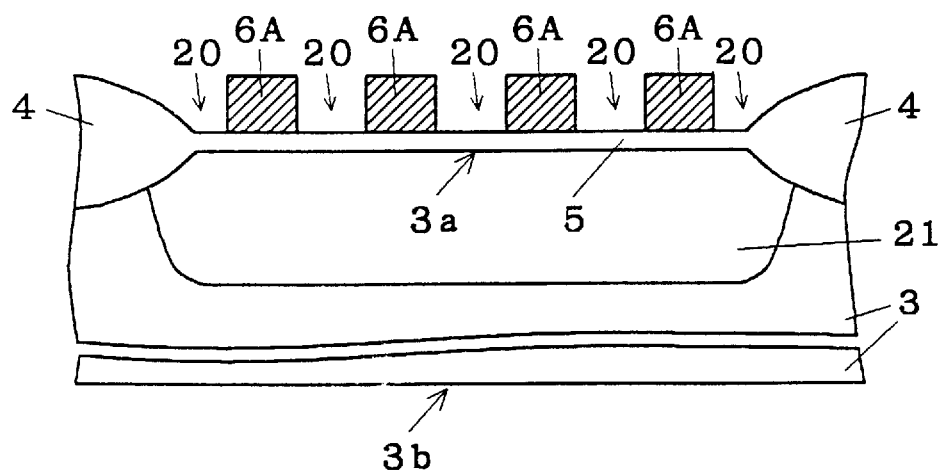
FIG. 12 is a sectional view taken along the line Y6—Y6 in FIG. 11.

FIG. 11 and FIG. 12 are diagrams showing the structure of a dielectric film evaluating test structure according to a sixth preferred embodiment of the present invention. FIG. 11 is a plan view of the dielectric film evaluating test structure of the sixth preferred embodiment and FIG. 12 is a sectional view taken along the line Y6—Y6 in FIG. 11. In FIG. 11 and FIG. 12, reference numeral 4a denotes a field oxide film formed between the plurality of dielectric films (gate insulator films 5), and other parts shown by the same reference characters as those in FIG. 9 or FIG. 10 are parts the same as or corresponding to the parts shown by the same reference characters in FIG. 9 or FIG. 10.

The dielectric film evaluating test structure shown in FIG. 11 and FIG. 12 is different from the dielectric film evaluating test structure shown in FIG. 9 and FIG. 10 in that the dielectric films (gate insulator films 5) are formed in the plurality of regions surrounded by the field oxide film 4. Accordingly, in the dielectric film evaluating test structure shown in FIG. 11 and FIG. 12, the length of overlap of the gate electrodes 6A and the boundaries between the dielectric films and the field oxide film 4 per one evaluating test structure for the dielectric film 5 is longer than that in the dielectric film evaluating test structure shown in FIG. 1.

Accordingly, the effects of the boundary between the field oxide film 4 and the gate insulator films 5 can be clarified, increasing the accuracy in evaluating the effects of the boundary. Other effects are the same as those in the dielectric film evaluating test structure shown in FIG. 9 and FIG. 10.

Seventh Preferred Embodiment.

Figure 13:
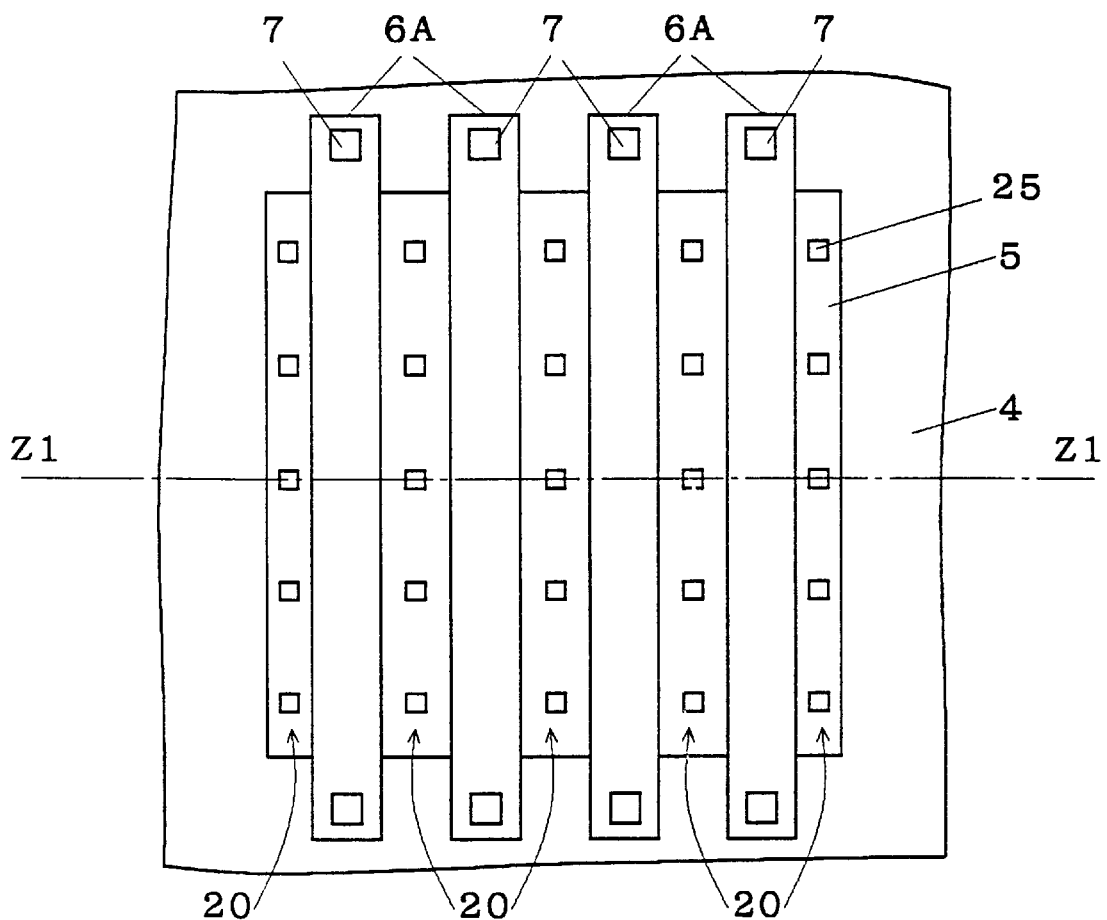
FIG. 13 is a plan view showing the structure of a dielectric film evaluating test structure according to a seventh preferred embodiment of the present invention.
Figure 14:
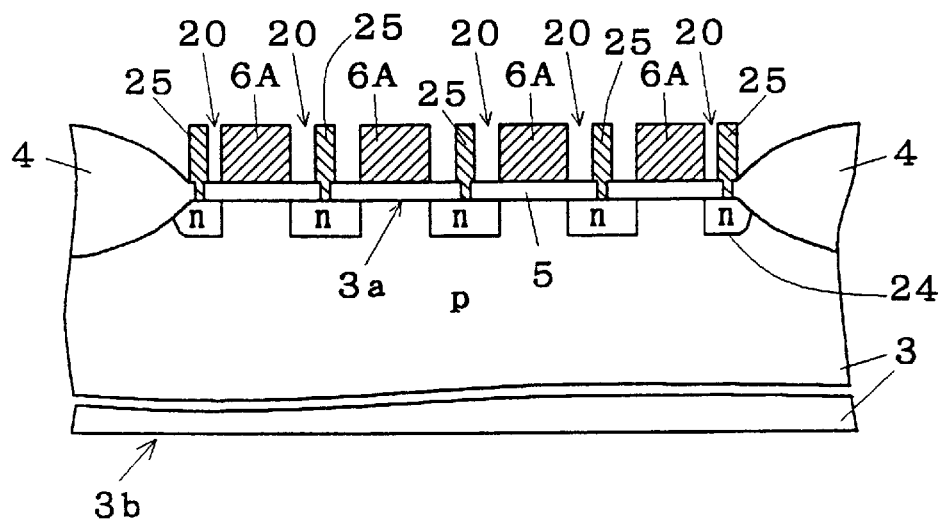
FIG. 14 is a sectional view taken along the line Z1—Z1 in FIG. 13.

FIG. 13 and FIG. 14 are diagrams showing the structure of a dielectric film evaluating test structure according to a seventh preferred embodiment of the present invention. FIG. 13 is a plan view of the dielectric film evaluating test structure of the seventh preferred embodiment and FIG. 14 is a sectional view taken along the line Z1—Z1 of FIG. 13. In FIG. 13 and FIG. 14, reference numeral 24 denotes source, drain regions formed by driving impurities into the one main surface 3a of the semiconductor substrate 3 through the gate insulator film 5 and having a different conductivity type from that of the semiconductor substrate 3, 25 denotes source, drain electrodes for making electric connection with the source, drain regions 24, and other parts shown by the same reference characters as those in FIG. 1 or FIG. 2 are parts the same as or corresponding to the parts shown by the same reference characters in FIG. 1 or FIG. 2.

The test structure in FIG. 13 and FIG. 14 is different from the first preferred embodiment in that the source, drain regions 24 are provided in the channel direction on both sides of the gate electrodes 6A.

By using the dielectric film evaluating test structure shown in FIG. 13 and FIG. 14, effects upon the dielectric film (gate insulator film 5) of an actual device when the source, drain regions 24 are formed can be evaluated in characteristic evaluation of the dielectric film (gate insulator film 5).

Furthermore, grounding (GND) the source, drain electrodes 25 using wiring material when making the breakdown ($V_{BD}$) evaluation, the time dependant dielectric breakdown (TDDB) evaluation, etc. of the dielectric film permits the direction of the electric field produced in the gate insulator film 5 to be either upward or downward, which enables stress evaluation both of the positive stress/negative stress to the dielectric film.

Eighth Preferred Embodiment.

Figure 15:
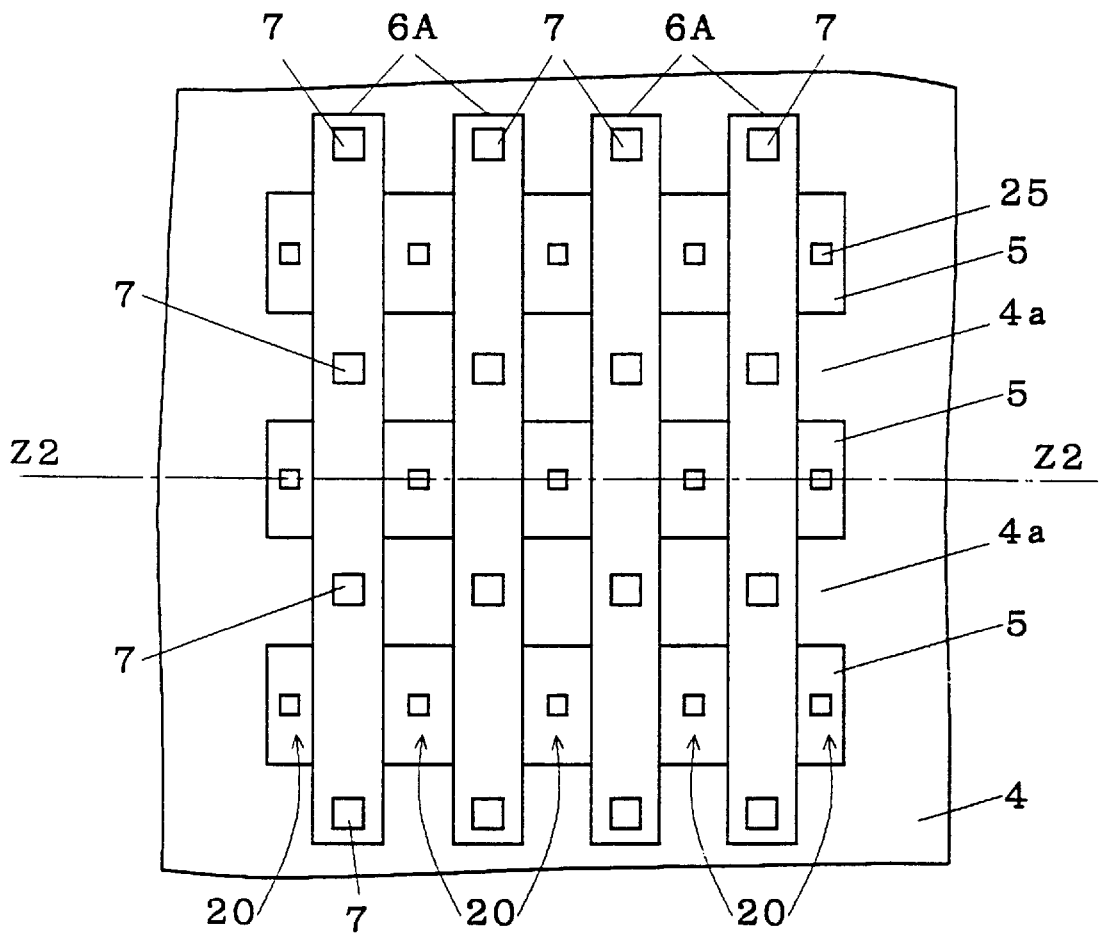
FIG. 15 is a plan view showing the structure of a dielectric film evaluating test structure according to an eighth preferred embodiment of the present invention.
Figure 16:
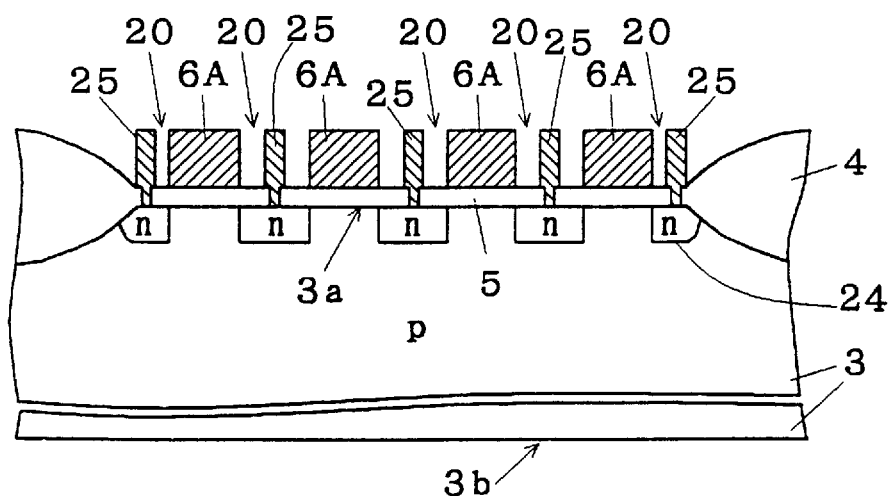
FIG. 16 is a sectional view taken along the line Z2—Z2 in FIG. 15.

FIG. 15 and FIG. 16 are diagrams showing the structure of a dielectric film evaluating test structure according to an eighth preferred embodiment of the present invention. FIG. 15 is a plan view of the dielectric film evaluating test structure of the eighth preferred embodiment and FIG. 16 is a sectional view taken along the line Z2—Z2 of FIG. 15. In FIG. 15 and FIG. 16, reference numeral 4a denotes a field oxide film formed between a plurality of dielectric films (gate insulator films 5), and other parts shown by the same reference characters as those in FIG. 13 or FIG. 14 are parts the same as or corresponding to those in FIG. 13 or FIG. 14.

The dielectric film evaluating test structure shown in FIG. 15 and FIG. 16 is different from the dielectric film evaluating test structure shown in FIG. 13 and FIG. 14 in that the dielectric films (gate insulator films 5) are formed in the plurality of regions surrounded by the field oxide film 4. Accordingly, the gate electrodes 6A are formed over a plurality of dielectric films, across the field oxide film 4a between the dielectric films. In the test structure shown in FIG. 15 and FIG. 16, the length of overlap of the gate electrodes 6A and the boundaries between the dielectric films and the field oxide film 4 per one evaluating test structure for the dielectric films (gate insulator films 5) is longer than that in the dielectric film evaluating test structure shown in FIG. 13 and FIG. 14. Accordingly, the effects of the boundary between the field oxide film 4 and the dielectric films can be clarified, improving the accuracy in evaluating the effects of the boundary. Other effects are the same as those of the dielectric film evaluating test structure shown in FIG. 13 and FIG. 14.

Ninth Preferred Embodiment.

Figure 17:
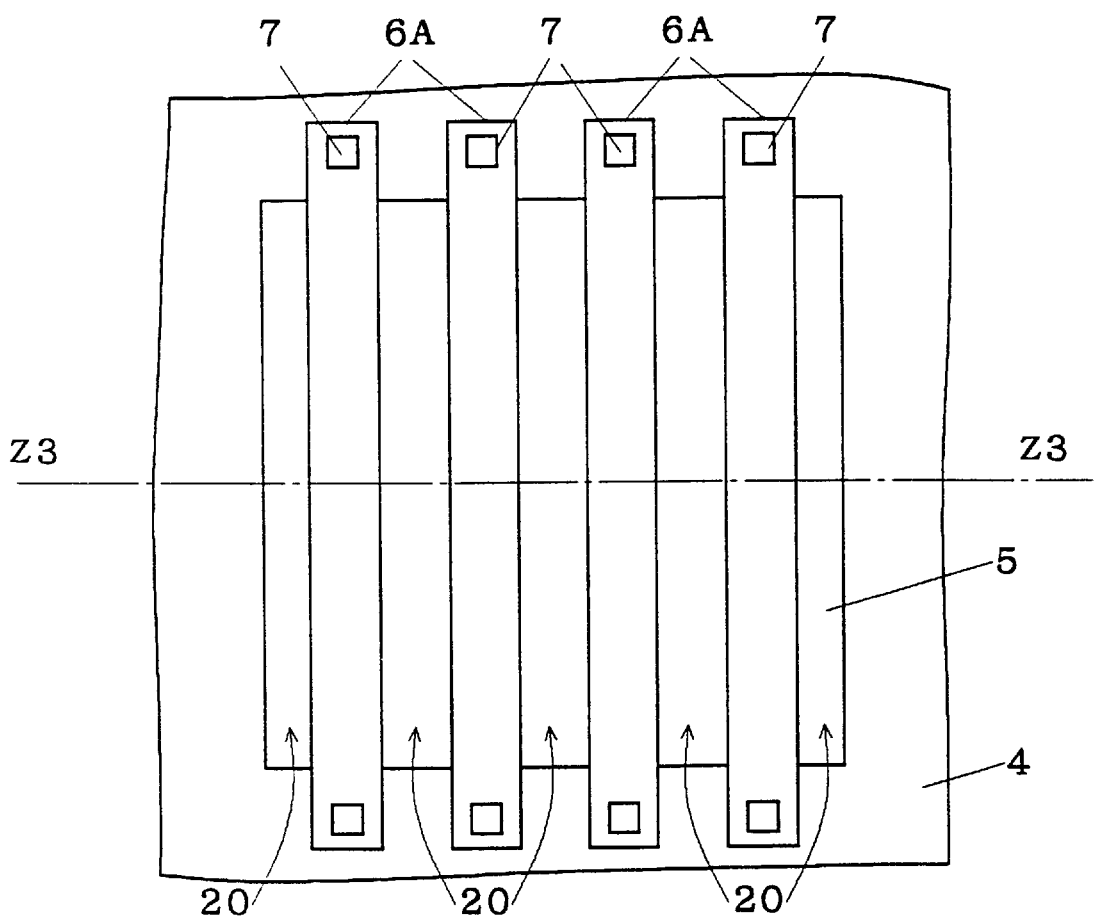
FIG. 17 is a plan view showing the structure of a dielectric film evaluating test structure according to a ninth preferred embodiment of the present invention.
Figure 18:
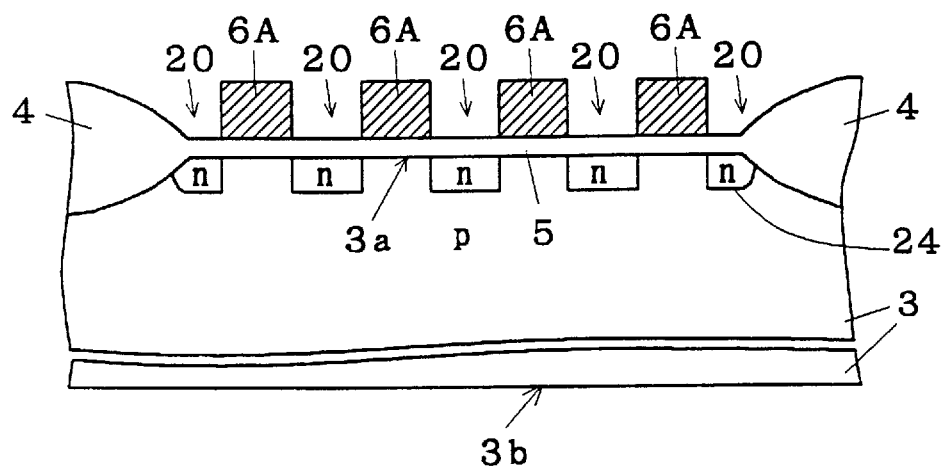
FIG. 18 is a sectional view taken along the line Z3—Z3 in FIG. 17.

FIG.17 and FIG.18 are diagrams showing the structure of a devaluating test evaluating test structure according to a ninth preferred embodime invention. FIG. 17 is a plan view of the dielectric film evaluating test structure of the ninth preferred embodiment and FIG. 18 is a sectional view taken along the line Z3—Z3 of FIG. 17. In FIG. 17 and FIG. 18, the parts shown by the same reference characters as those in FIG. 13 or FIG. 14 are parts the same as or corresponding to those shown by the same reference characters in FIG. 13 or FIG. 14.

The test structure of FIG. 17 and FIG. 18 is different from the seventh preferred embodiment in that the source, drain electrodes 25 connected to the source, drain regions 24 are eliminated.

By using the dielectric film evaluating test structure shown in FIG. 17 and FIG. 18, when making characteristic evaluation of the dielectric film (gate insulator film 5), the effects of damage caused to the dielectric film of an actual device when forming the source, drain regions 24 can be evaluated.

Although only one of the stress evaluations with positive stress/negative stress to the dielectric film can be made, as in the dielectric film evaluating test structure shown in FIG. 13 and FIG. 14, the structure simplified by removing the source, drain electrodes facilitates manufacturing.

Tenth Preferred Embodiment.

Figure 19:
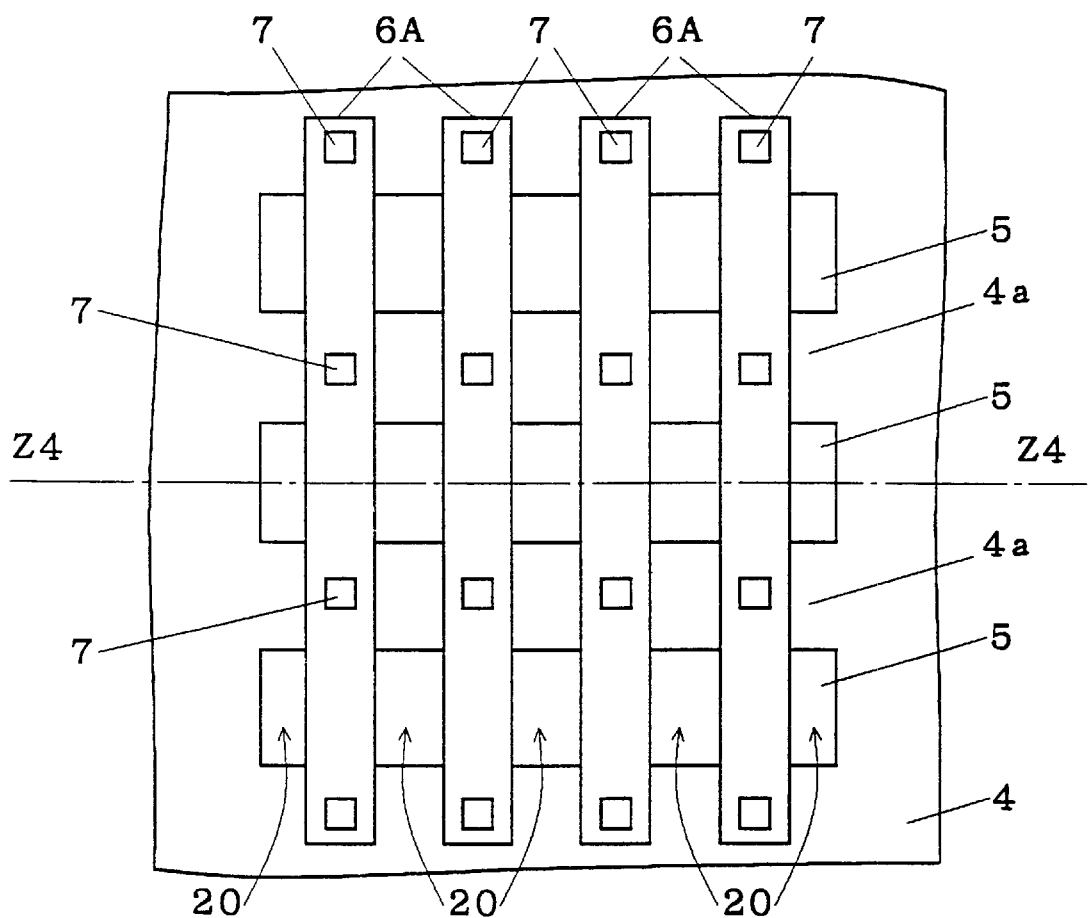
FIG. 19 is a plan view showing the structure of a dielectric film evaluating test structure according to a tenth preferred embodiment of the present invention.
Figure 20:
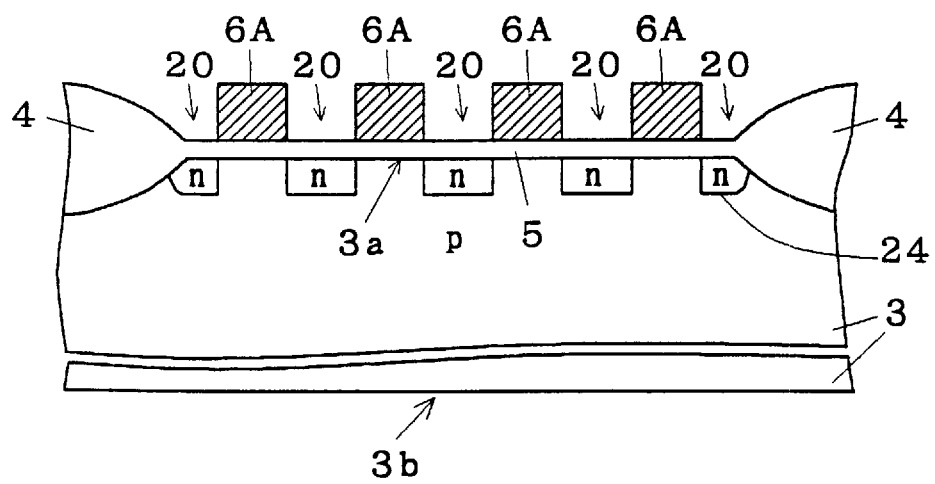
FIG. 20 is a sectional view taken along the line Z4—Z4 in FIG. 19.

FIG. 19 and FIG. 20 are diagrams showing the structure of a dielectric film evaluating test structure according to a tenth preferred embodiment of the present invention. FIG. 19 is a plan view of the dielectric film evaluating test structure of the tenth preferred embodiment and FIG. 20 is a sectional view taken along the line Z4—Z4 of FIG. 19. In FIG. 19 and FIG. 20, reference numeral 4a denotes a field oxide film formed between the plurality of dielectric films (gate insulator films 5), and other parts shown by the same reference characters as those in FIG. 17 and FIG. 18 are parts the same as or corresponding to those shown by the same reference characters in FIG. 17 or FIG. 18.

The dielectric film evaluating test structure shown in FIG. 19 and FIG. 20 is different from the dielectric film evaluating test structure shown in FIG. 17 and FIG. 18 in that the dielectric films (gate insulator films 5) are formed in the plurality of regions surrounded by the field oxide film 4. Accordingly, the gate electrode 6A is formed over a plurality of dielectric films, across the field oxide film 4a between the dielectric films. In the test structure shown in FIG. 19 and FIG. 20, the length of overlap of the gate electrodes 6A and the boundaries between the dielectric films and the field oxide film 4 per one evaluating test structure for the dielectric films (gate insulator films 5) is longer than that in the dielectric film evaluating test structure shown in FIG. 17 and FIG. 18. Accordingly, the effects of the boundary between the field oxide film 4 and the dielectric films can be cleared up, improving the accuracy in evaluating the effects of the boundary. Other effects are the same as those of the dielectric film evaluating test structure shown in FIG. 17 and FIG. 18.

Eleventh Preferred Embodiment.

Figure 21:
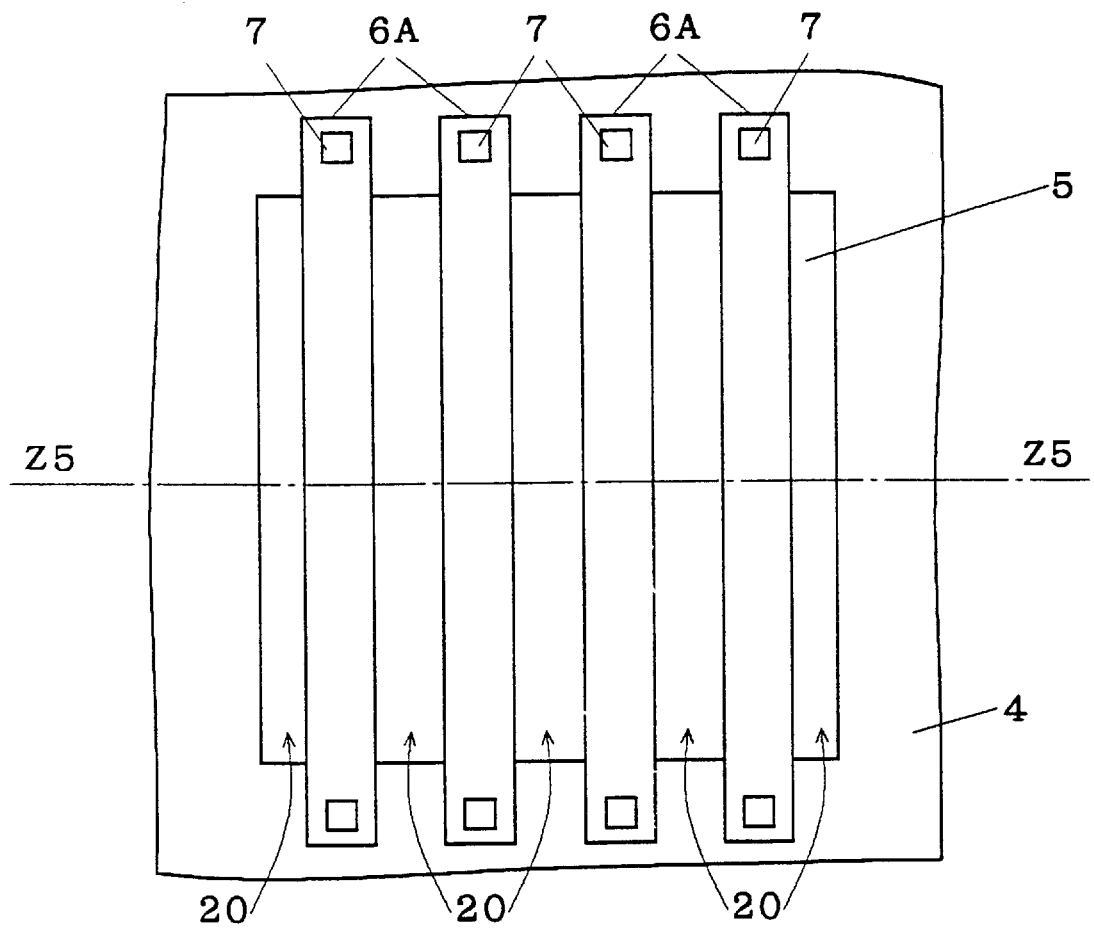
FIG. 21 is a plan view showing the structure of a dielectric film evaluating test structure according to an eleventh preferred embodiment of the present invention.
Figure 22:
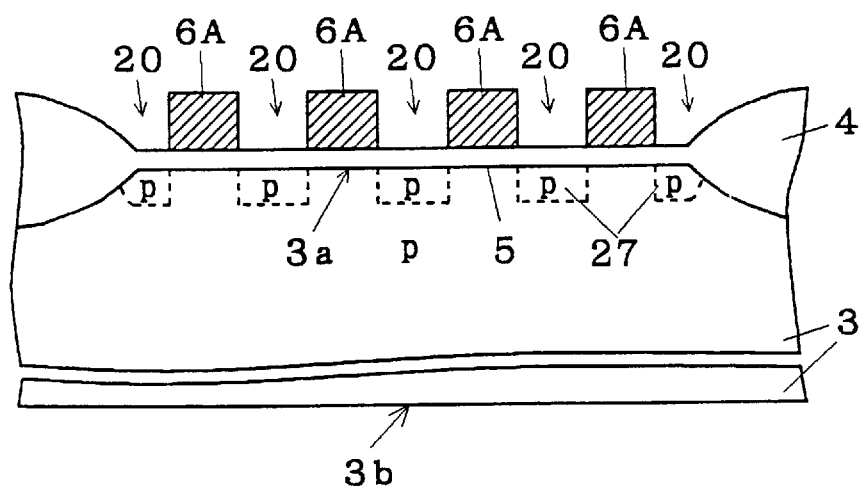
FIG. 22 is a sectional view taken along the line Z5—Z5 in FIG. 21.

FIG. 21 and FIG. 22 are diagrams showing the structure of a dielectric film evaluating test structure according to an eleventh preferred embodiment of the present invention. FIG. 21 is a plan view of the dielectric film evaluating test structure of the eleventh preferred embodiment and FIG. 22 is a sectional view taken along the line Z5—Z5 of FIG. 21. In FIG. 21 and FIG. 22, reference numeral 27 denotes semiconductor regions formed by driving impurities into the one main surface 3a of the semiconductor substrate 3 through the gate insulator film 5 and having the same conductivity type as that of the semiconductor substrate 3, and other parts shown by the same reference characters as those in FIG. 13 or FIG. 14 are parts the same as or corresponding to those shown by the same reference characters in FIG. 13 or FIG. 14.

The test structure in FIG. 21 and FIG. 22 is different from the seventh preferred embodiment in that the semiconductor regions 27 are formed instead of the source, drain regions 24 in the channel direction on both sides of the gate electrodes 6A. Since the impurities are driven through the gate insulator film 5 when forming the semiconductor regions 27, the gate insulator film 5 is damaged at that time.

Using the dielectric film evaluating test structure shown in FIG. 21 and FIG. 22 when evaluating the characteristics of the dielectric film (gate insulator film 5) allows evaluation of the effects of damage upon the dielectric film of an actual device caused when forming the source, drain regions.

Furthermore, as the semiconductor regions 27 have the same conductivity type as that of the semiconductor substrate 3, both stresses, the positive stress/negative stress, to the dielectric film can be evaluated when performing the breakdown voltage ($V_{BD}$) evaluation, the time dependent dielectric breakdown (TDDB) evaluation, etc. of the dielectric film (gate insulator film 5).

Twelfth Preferred Embodiment.

Figure 23:
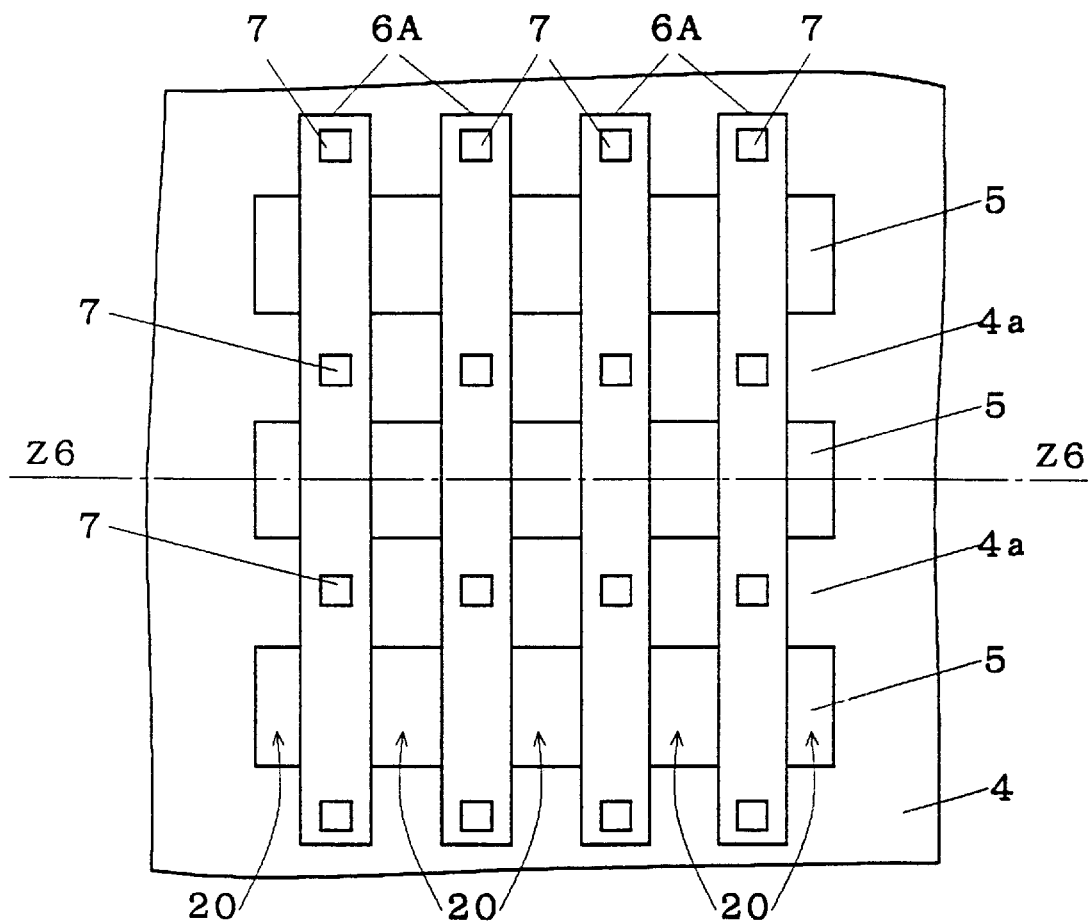
FIG. 23 is a plan view showing the structure of a dielectric film evaluating test structure according to a twelfth preferred embodiment of the present invention.
Figure 24:
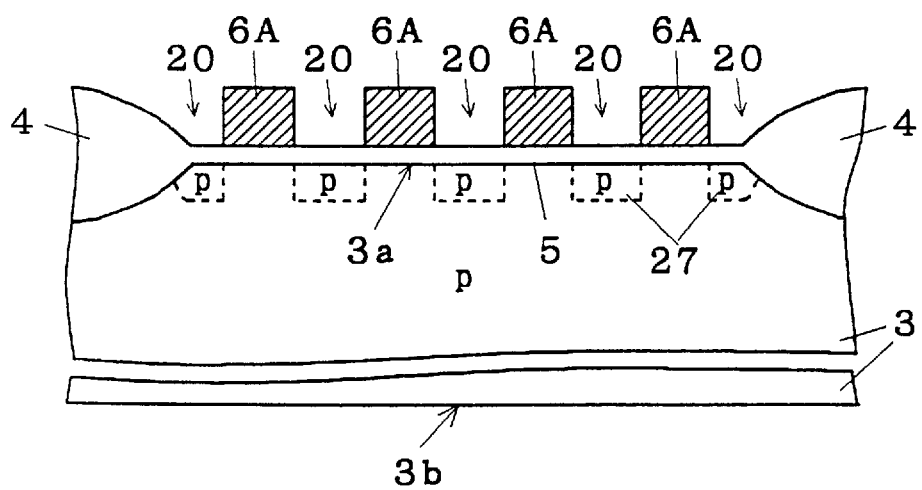
FIG. 24 is a sectional view taken along the line Z6—Z6 in FIG. 23.

FIG. 23 and FIG. 24 are diagrams showing the structure of a dielectric film evaluating test structure according to a twelfth preferred embodiment of the present invention. FIG. 23 is a plan view of the dielectric film evaluating test structure of the twelfth preferred embodiment and FIG. 24 is a sectional view taken along the line Z6—Z6 of FIG. 23. In FIG. 23 and FIG. 24, reference numeral 4a denotes a field oxide film formed between the plurality of dielectric films (gate insulator films 5), and other parts shown by the same reference characters as those in FIG. 21 or FIG. 22 are parts the same as or corresponding to those shown by the same reference characters in FIG. 21 or FIG. 22.

The dielectric film evaluating test structure shown in FIG. 23 and FIG. 24 is different from the dielectric film evaluating test structure shown in FIG. 21 and FIG. 22 in that the dielectric films (gate insulator films 5) are formed in the plurality of regions surrounded by the field oxide film 4. Accordingly, the gate electrode 6A is formed over a plurality of dielectric films, across the field oxide film 4a between the dielectric films. In the test structure shown in FIG. 23 and FIG. 24, the length of overlap of the gate electrode 6A and the boundary between the dielectric films and the field oxide film 4 per one evaluating test structure for the dielectric films (gate insulator films 5) is longer than that in the dielectric film evaluating test structure shown in FIG. 21 and FIG. 22. Accordingly, the effects of the boundary between the field oxide film 4 and the dielectric films can be cleared, improving the evaluation accuracy for the effects of the boundary. Other effects are the same as those of the dielectric film evaluating test structure shown in FIG. 21 and FIG. 22.

Thirteenth Preferred Embodiment.

Figure 25:
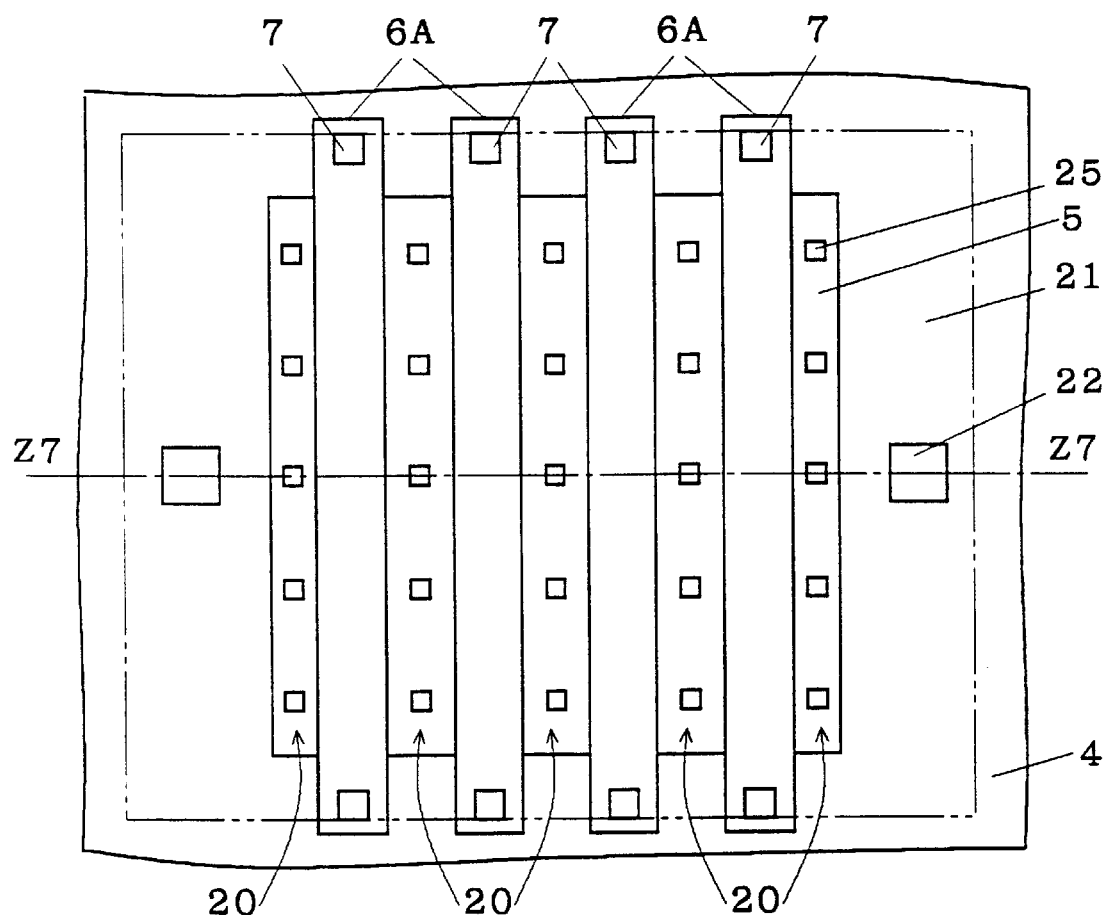
FIG. 25 is a plan view showing the structure of a dielectric film evaluating test structure according to a thirteenth preferred embodiment of the present invention.
Figure 26:
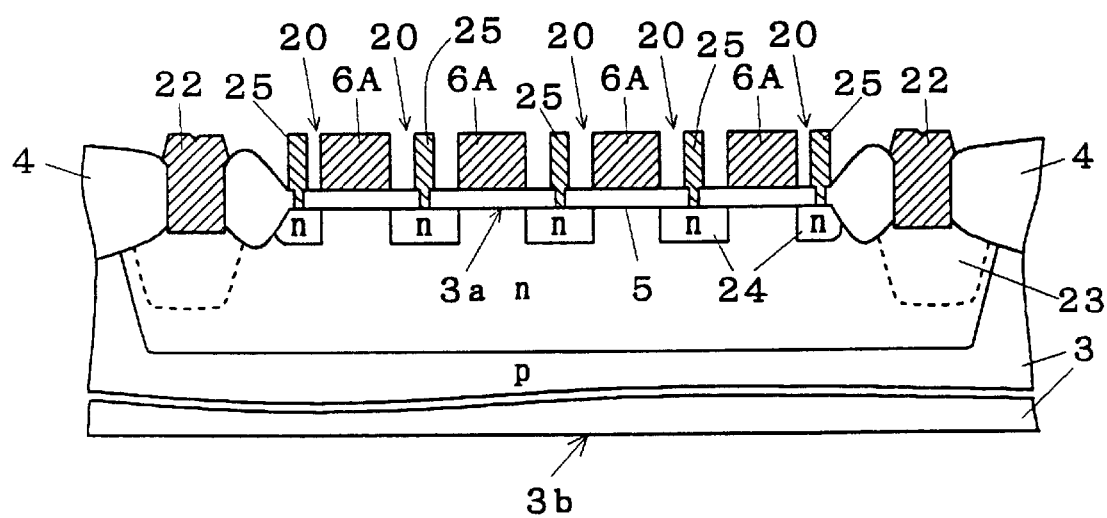
FIG. 26 is a sectional view taken along the line Z7—Z7 in FIG. 25.

FIG. 25 and FIG. 26 are diagrams showing the structure of a dielectric film evaluating test structure according to a thirteenth preferred embodiment of the present invention. FIG. 25 is a plan view of the dielectric film evaluating test structure of the thirteenth preferred embodiment and FIG. 26 is a sectional view taken along the line Z7—Z7 of FIG. 25. In FIG. 25 and FIG. 26, reference numeral 21 denotes a well formed in one main surface 3a of the semiconductor substrate 3 under the gate insulator film 5, 22 denotes well contacts for applying a certain voltage between the well 21 and the gate electrodes 6A, 23 denotes semiconductor regions formed for good connection between the well 21 and the well contacts 22 and having an impurity concentration higher than that of the well 21, and other parts shown by the same reference characters as those in FIG. 13 or FIG. 14 are parts the same as or corresponding to those shown by the same reference characters in FIG. 13 or FIG. 14.

The test structure shown in FIG. 25 and FIG. 26 is characterized in that the well 21 is formed in the one main surface 3a of the semiconductor substrate 3, which is not formed in the test structure of the seventh preferred embodiment shown in FIG. 13 and FIG. 14.

The test structure shown in FIG. 25 and FIG. 26 has the plurality of gate electrodes 6A formed by the gate electrode etching process and having its channel length shorter than the channel width (refer to FIG. 1 and FIG. 2), the source, drain regions 24 (refer to FIG. 13 ad FIG. 14) and the well 21 (refer to FIG. 5 and FIG. 6.) Hence, by using the dielectric film evaluating test structure shown in FIG. 25 and FIG. 26, evaluation results can be obtained, considering all external factors, such as damage caused by formation of the gate electrodes 6A, the damage caused by formation of the source, drain regions 24, and effects caused by formation of the well 21.

For example, junction leakage evaluation between the source, drain regions 24 and the well 21 can be performed. The structure also enables evaluation in a structure applied to a shallow well structure used for soft error measures. The potential of the well 21 can be maintained constant, and the dielectric film can be evaluated correctly. Furthermore, by manufacturing the elements 2 on the single wafer 1 shown in FIG. 38 into type and N type using a mask and using two elements of different conductivity types, it also can perform evaluation of a CMOS structure.

Fourteenth Preferred Embodiment.

Figure 27:
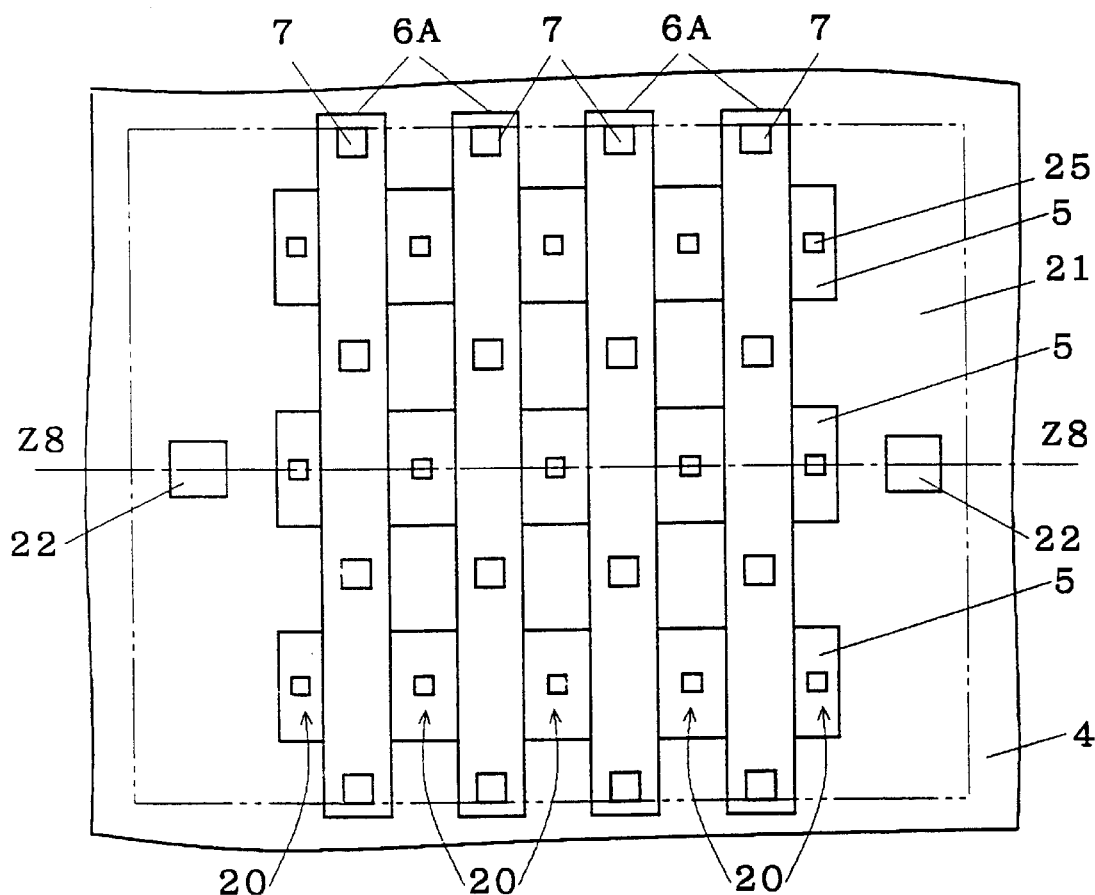
FIG. 27 is a plan view showing the structure of a dielectric film evaluating test structure according to a fourteenth preferred embodiment of the present invention.
Figure 28:
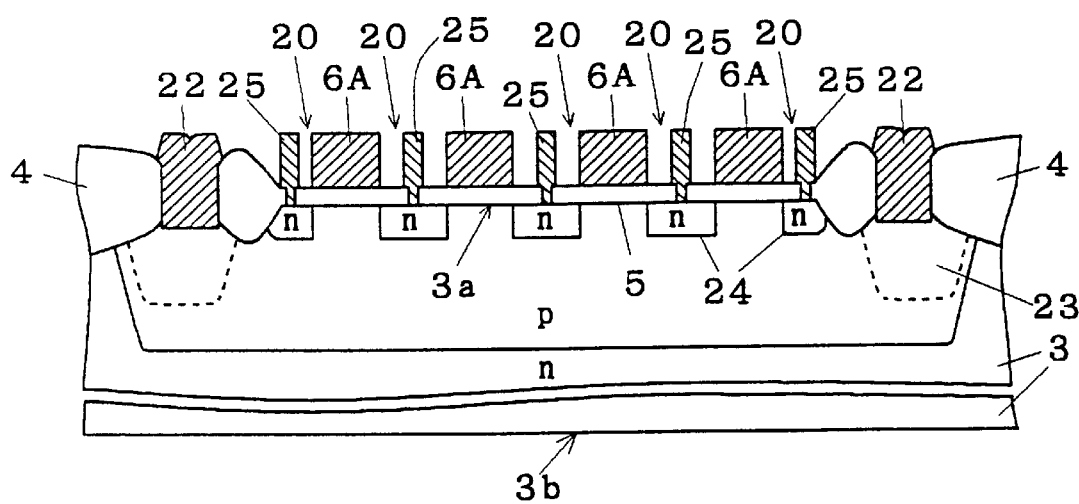
FIG. 28 is a sectional view taken along the line Z8—Z8 in FIG. 27.

FIG. 27 and FIG. 28 are diagrams showing the structure of a dielectric film evaluating test structure according to a fourteenth preferred embodiment of the present invention. FIG. 27 is a plan view of the dielectric film evaluating test structure of the fourteenth preferred embodiment and FIG. 28 is a sectional view taken along the line Z8—Z8 of FIG. 27. In FIG. 27 and FIG. 28, reference numeral 4a denotes a field oxide film formed between the plurality of dielectric films (gate insulator films 5), and other parts shown by the same reference characters as those in FIG. 25 or FIG. 26 are parts the same as or corresponding to those shown by the same reference characters in FIG. 25 or FIG. 26.

The dielectric film evaluating test structure shown in FIG. 27 and FIG. 28 is different from the dielectric film evaluating test structure shown in FIG. 25 and FIG. 26 in that the dielectric films (gate insulator films 5) are formed in a plurality of regions surrounded by the field oxide film 4. Accordingly, the gate electrode 6A is formed over a plurality of dielectric films, across the field oxide film 4a between the dielectric films. In the test structure shown in FIG. 27 and FIG. 28, the length of the overlap of the gate electrodes 6A and the boundaries between the dielectric films and the field oxide film 4 per one evaluating test structure for the dielectric films (gate insulator films 5) is longer than that in the dielectric film evaluating test structure shown in FIG. 25 and FIG. 26. Accordingly, the effects of the boundary between the field oxide film 4 and the dielectric films can be clarified, improving the accuracy in evaluating the effects of the boundary. Other effects are the same as those of the dielectric film evaluating test structure shown in FIG. 25 and FIG. 26.

Fifteenth Preferred Embodiment.

Figure 29:
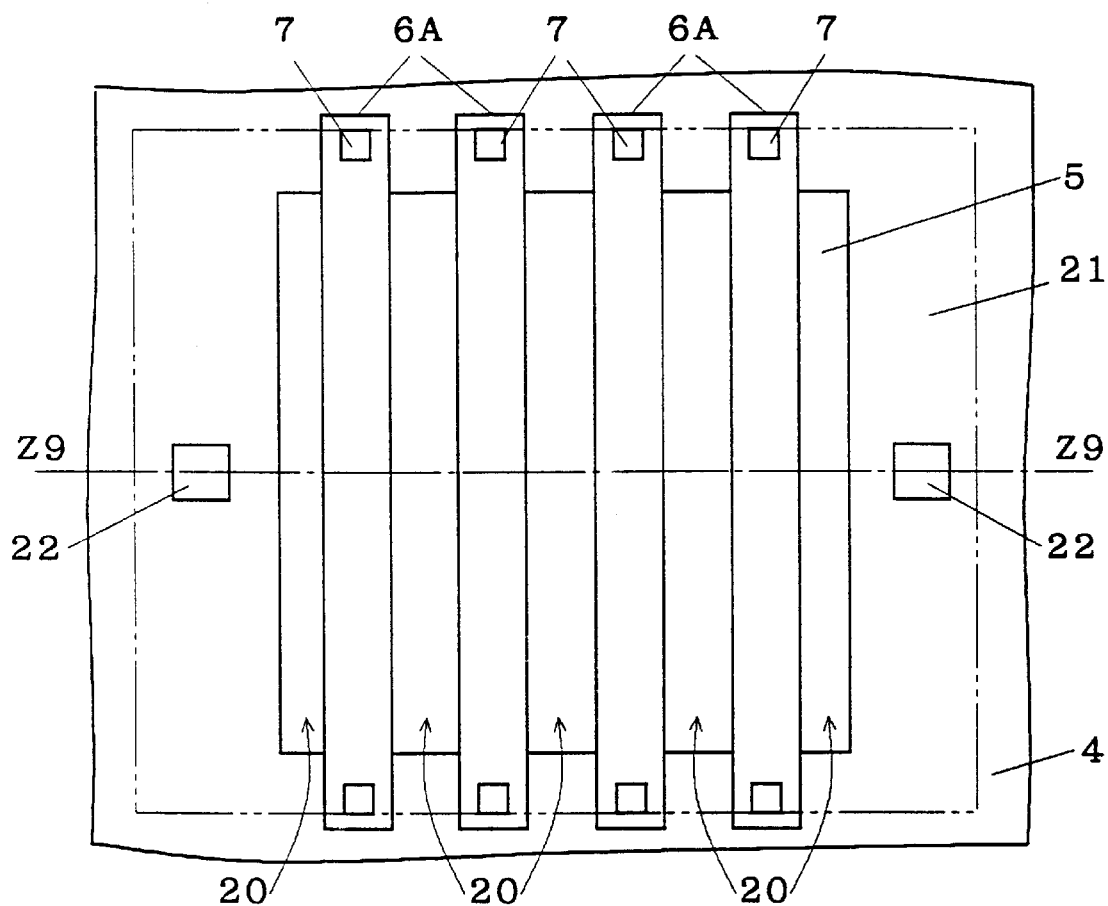
FIG. 29 is a plan view showing the structure of a dielectric film evaluating test structure according to a fifteenth preferred embodiment of the present invention.
Figure 30:
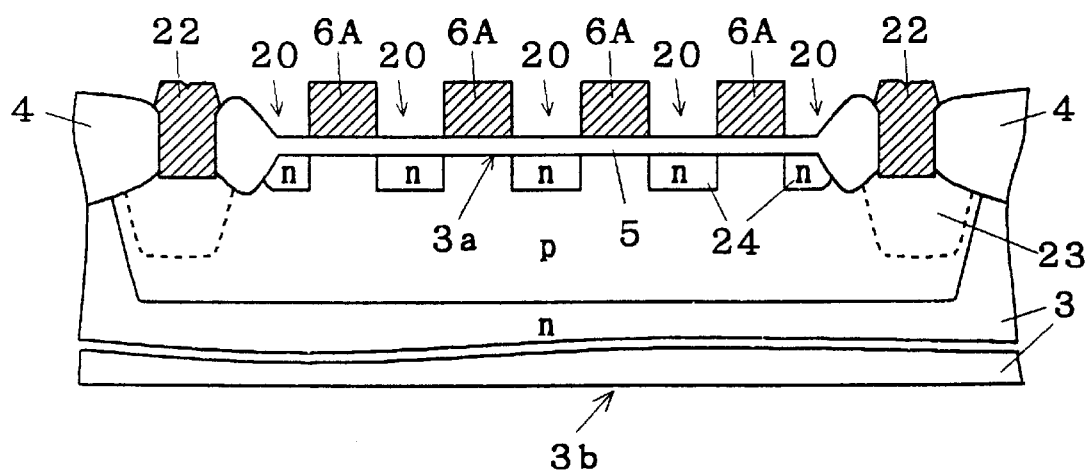
FIG. 30 is a sectional view taken along the line Z9—Z9 in FIG. 29.

FIG. 29 and FIG. 30 are diagrams showing the structure of a dielectric film evaluating test structure according to a fifteenth preferred embodiment of the present invention. FIG. 29 is a plan view of the dielectric film evaluating test structure of the fifteenth preferred embodiment and FIG. 30 is a sectional view taken along the line Z9—Z9 of FIG. 29. In FIG. 29 and FIG. 30, reference numeral 21 denotes a well formed in one main surface $3a$ of the semiconductor substrate 3 under the gate insulator film 5, and other parts shown by the same reference characters as those in FIG. 17 or FIG. 18 are parts the same as or corresponding to those shown by the same reference characters in FIG. 17 or FIG. 18.

The test structure shown in FIG. 29 and FIG. 30 is characterized in that the well 21, which is not formed in the test structure of the ninth preferred embodiment shown in FIG. 17 and FIG. 18, is formed in the one main surface $3a$ of the semiconductor substrate 3. Accordingly, it has the same effects as those of the dielectric film evaluating test structure of the thirteenth preferred embodiment shown in FIG. 25 and FIG. 26.

Furthermore, as the dielectric film evaluating test structure shown in FIG. 29 and FIG. 30 does not have the source, drain electrodes 25 formed in the dielectric film evaluating test structure shown in FIG. 17 and FIG. 18, the simple structure makes manufacturing of the test structure easy. Since a depletion layer is produced in the well 21, however, correct evaluation can be made only when the potential in the gate electrode 6A is higher than the potential in the well 21, in which point the dielectric film evaluating test structure of the thirteenth preferred embodiment is superior in that evaluation can be made both when the gate electrode 6A has a higher voltage and when it has a lower voltage with respect to the well 21.

Sixteenth Preferred Embodiment.

Figure 31:
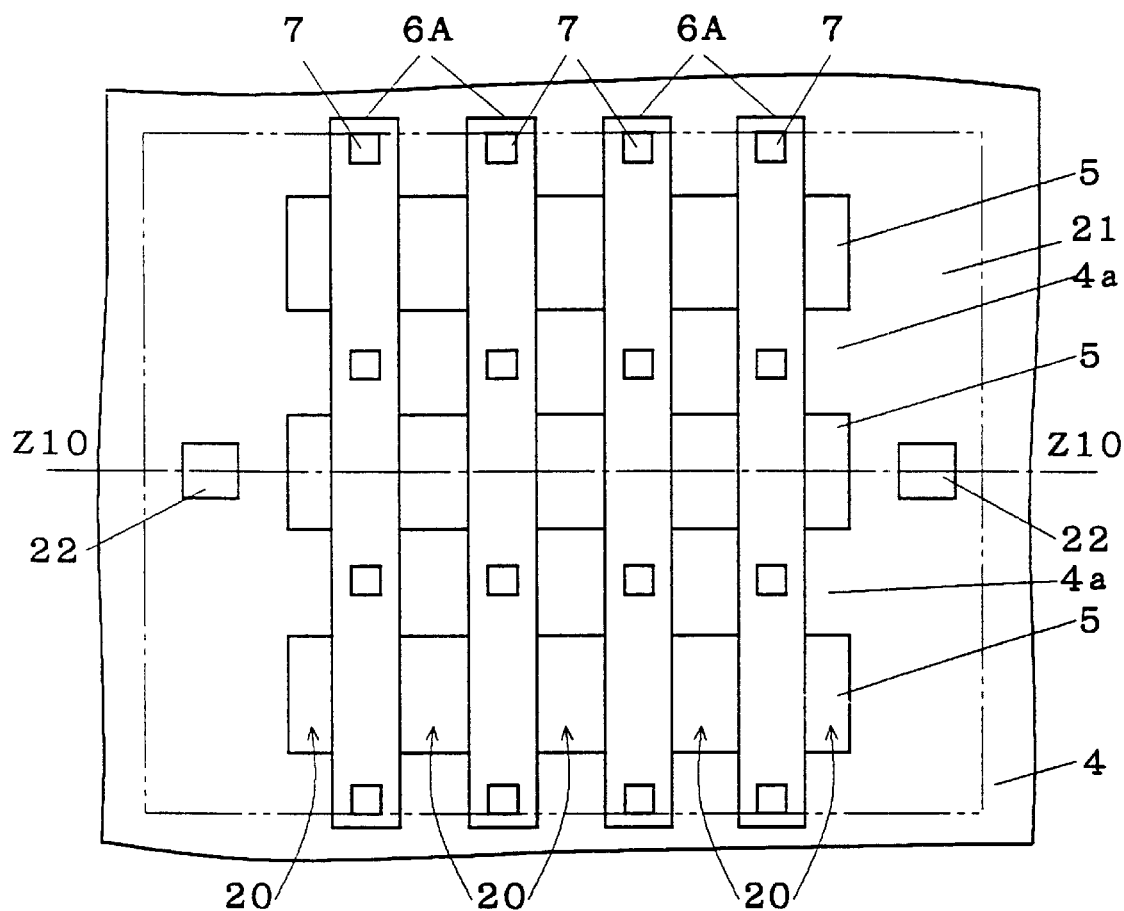
FIG. 31 is a plan view showing the structure of a dielectric film evaluating test structure according to a sixteenth preferred embodiment of the present invention.
Figure 32:
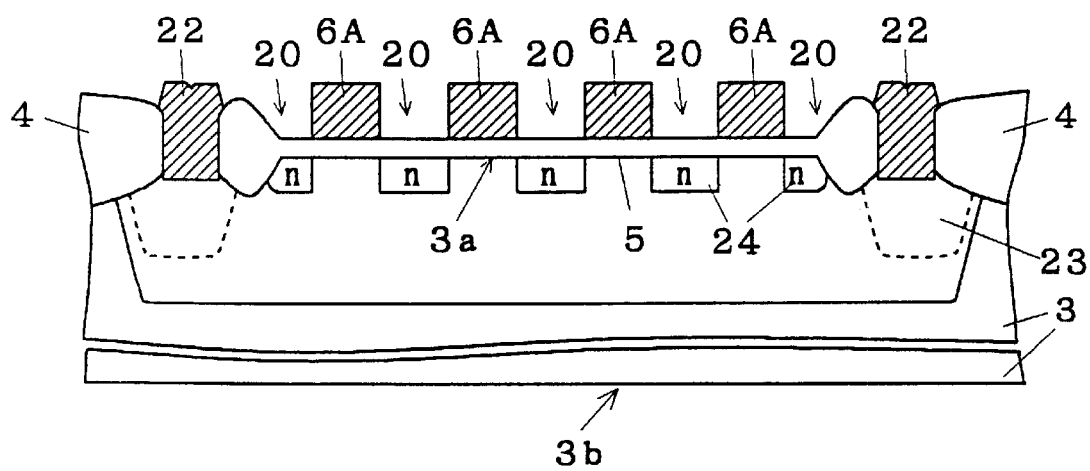
FIG. 32 is a sectional view taken along the line Z10—Z10 in FIG. 31.

FIG. 31 and FIG. 32 are diagrams showing the structure of a dielectric film evaluating test structure according to a sixteenth preferred embodiment of the present invention. FIG. 31 is a plan view of the dielectric film evaluating test structure of the sixteenth preferred embodiment and FIG. 32 is a sectional view taken along the line Z10—Z10 of FIG. 31. In FIG. 31 and FIG. 32, reference numeral $4a$ denotes a field oxide film formed between the plurality of dielectric films (gate insulator films 5), and other parts shown by the same reference characters as those in FIG. 29 or FIG. 30 are parts the same as or corresponding to those shown by the same reference characters in FIG. 29 or FIG. 30.

The dielectric film evaluating test structure shown in FIG. 31 and FIG. 32 is different from the dielectric film evaluating test structure shown in FIG. 29 and FIG. 30 in that the dielectric films are formed in the plurality of regions surrounded by the field oxide film 4. Accordingly, in the test structure shown in FIG. 31 and FIG. 32, the length of the overlap of the gate electrode 6A and the boundary between the gate insulator films 5 and the field oxide film 4 per one evaluating test structure for the dielectric films (gate insulator films 5) is longer than that in the dielectric film evaluating test structure shown in FIG. 29 and FIG. 30. Accordingly, the effects of the boundary between the field oxide film 4 and the dielectric films can be cleared up, improving the evaluation accuracy for the effects of the boundary.

Other effects are the same as those of the dielectric film evaluating test structure shown in FIG. 29 and FIG. 30.

Seventeenth Preferred Embodiment.

Figure 33:
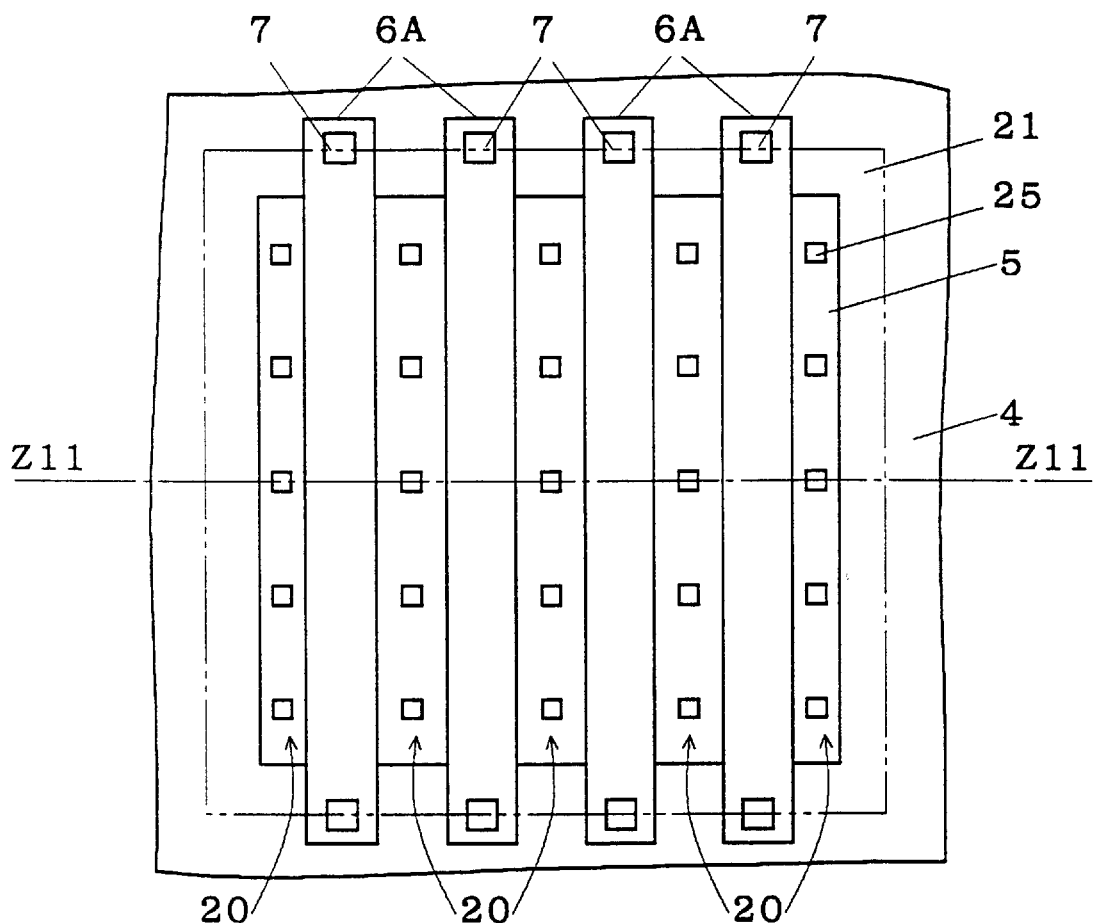
FIG. 33 is a plan view showing the structure of a dielectric film evaluating test structure according to a seventeenth preferred embodiment of the present invention.
Figure 34:
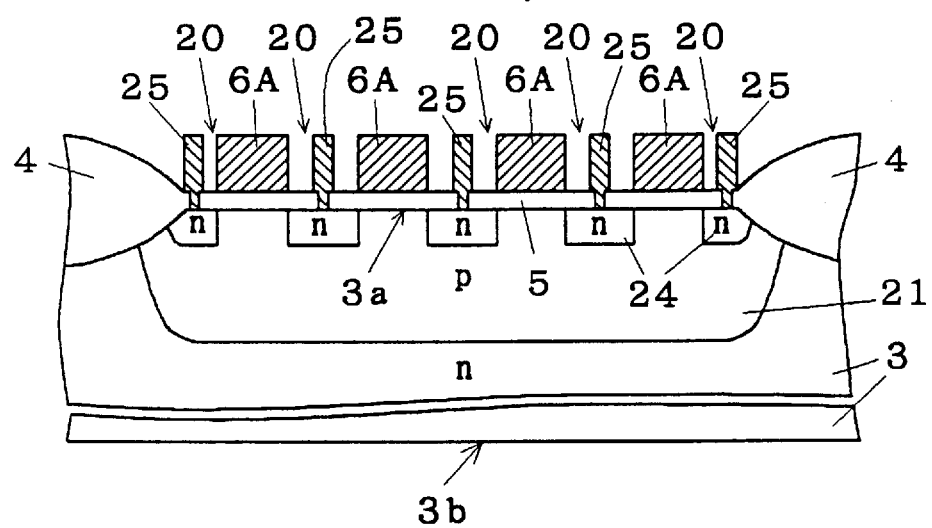
FIG. 34 is a sectional view taken along the line Z11—Z11 in FIG. 33.

FIG. 33 and FIG. 34 are diagrams showing the structure of a dielectric film evaluating test structure according to a seventeenth preferred embodiment of the present invention. FIG. 33 is a plan view of the dielectric film evaluating test structure of the seventeenth preferred embodiment and FIG. 34 is a sectional view taken along the line Z11—Z11 of FIG. 33. In FIG. 33 and FIG. 34, reference numeral 21 denotes a well formed in one main surface $3a$ of the semiconductor substrate 3 under the gate insulator film 5, and other parts shown by the same reference characters as those in FIG. 25 or FIG. 26 are parts the same as or corresponding to those shown by the same reference characters in FIG. 25 or FIG. 26.

The test structure shown in FIG. 33 and FIG. 34 is characterized in that the well 21, which is not formed in the test structure of the thirteenth preferred embodiment shown in FIG. 13 and FIG. 14, is formed in the one main surface $3a$ of the semiconductor substrate 3. Accordingly, it has the same effects as those of the dielectric film evaluating test structure of the thirteenth preferred embodiment shown in FIG. 25 and FIG. 26.

Furthermore, as the dielectric film evaluating test structure shown in FIG. 33 and FIG. 34 does not have the well contacts 22 and the semiconductor regions 23 formed in the dielectric film evaluating test structure shown in FIG. 25 and FIG. 26, the structure is simple and manufacturing of the test structure is easy. Since a PN junction is made between the well 21 and the semiconductor substrate 3, however, correct evaluation can be made only when an electric field is generated only in a certain one direction, in which point the dielectric film evaluating test structure of the thirteenth preferred embodiment is superior in that evaluation can be made both when the gate electrode 6A has a higher voltage relative to the well 21 and when it has a lower voltage.

Eighteenth Preferred Embodiment.

Figure 35:
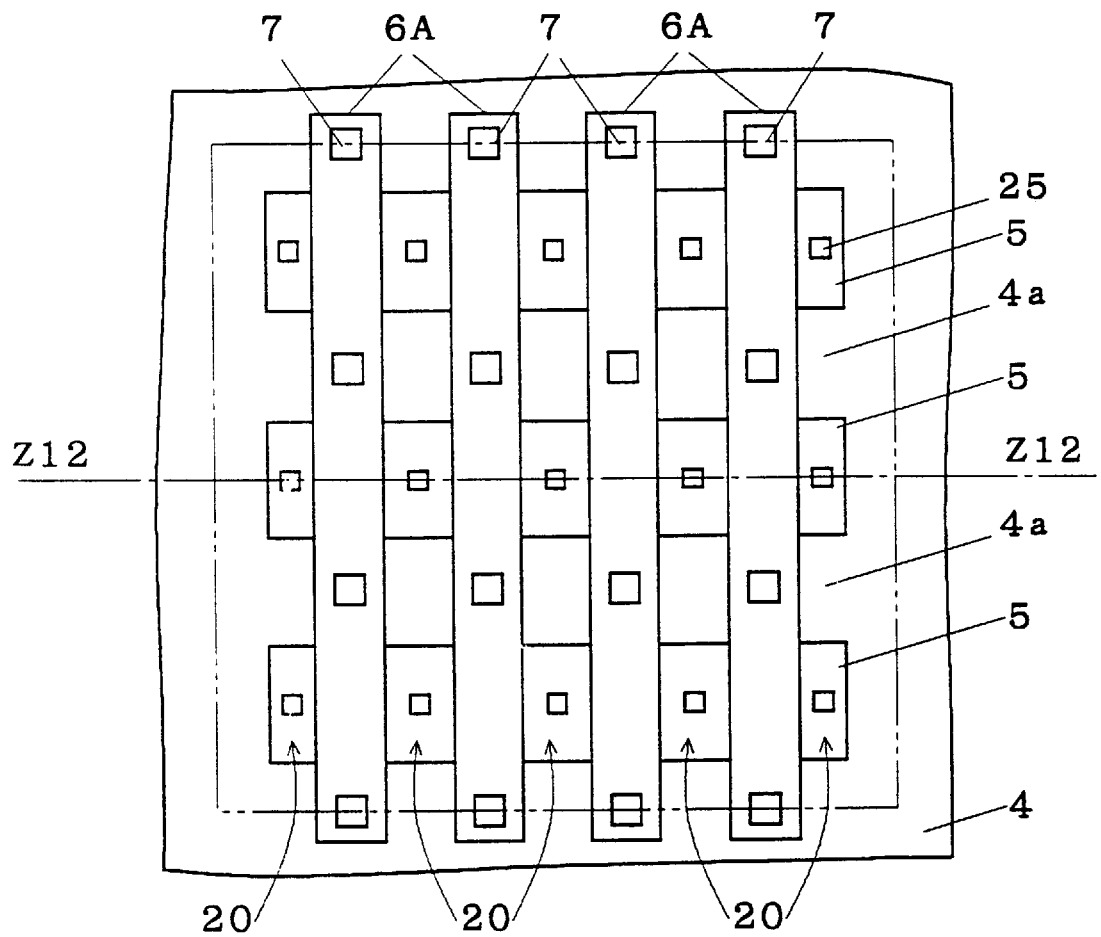
FIG. 35 is a plan view showing the structure of a dielectric film evaluating test structure according to an eighteenth preferred embodiment of the present invention.
Figure 36:
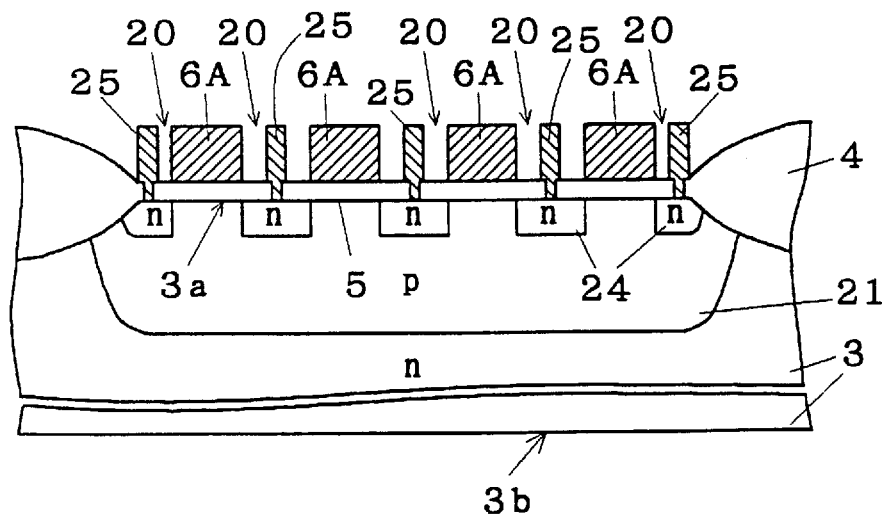
FIG. 36 is a sectional view taken along the line Z12—Z12 in FIG. 35.
Figure 39:
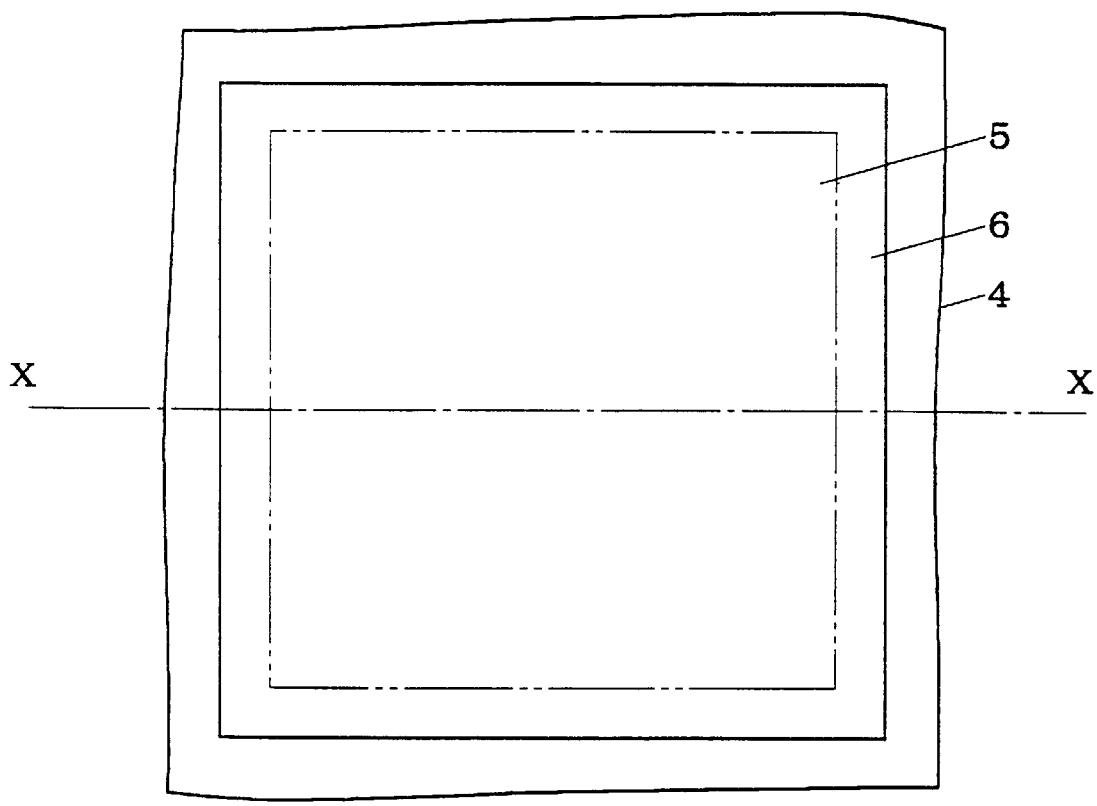
FIG. 39 is a plan view showing a conventional dielectric film evaluating test structure.
Figure 40:
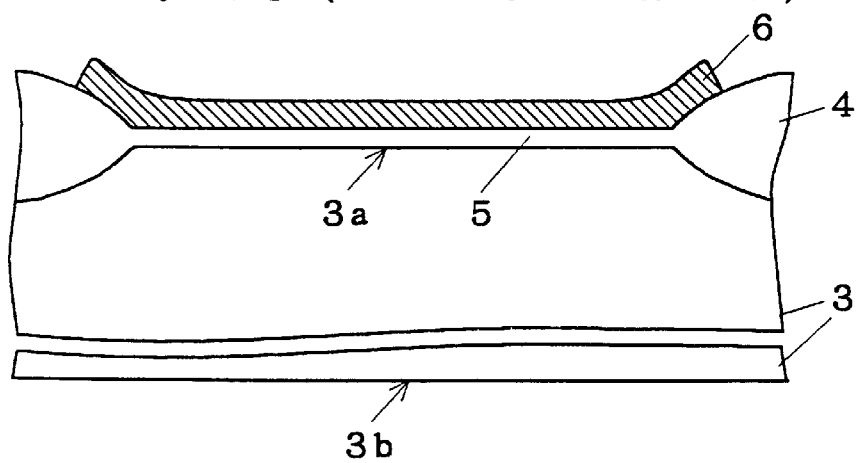
FIG. 40 is a sectional view taken along the line X—X in FIG. 39.
Figure 41:
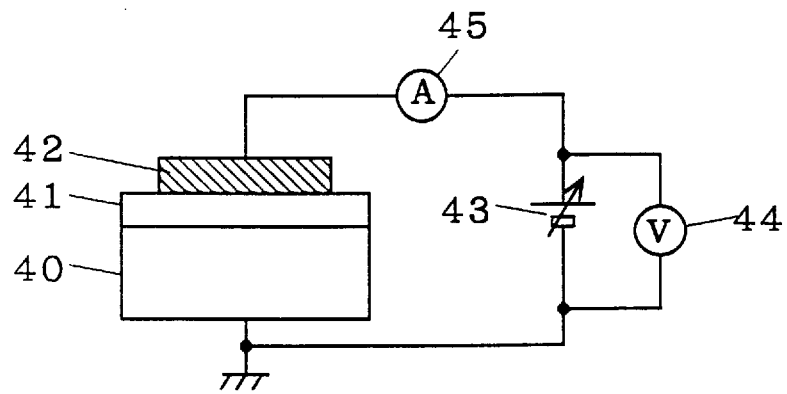
FIG. 41 is a conceptional view of a device for carrying out the breakdown voltage, I-V characteristic and TDDB tests.
Figure 42:
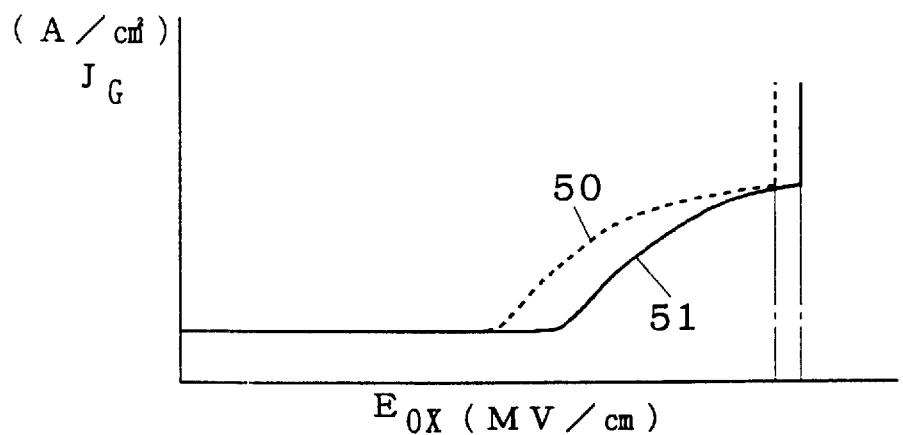
FIG. 42 is a graph showing an example of results of the I-V characteristic test and the breakdown voltage test.
Figure 43:
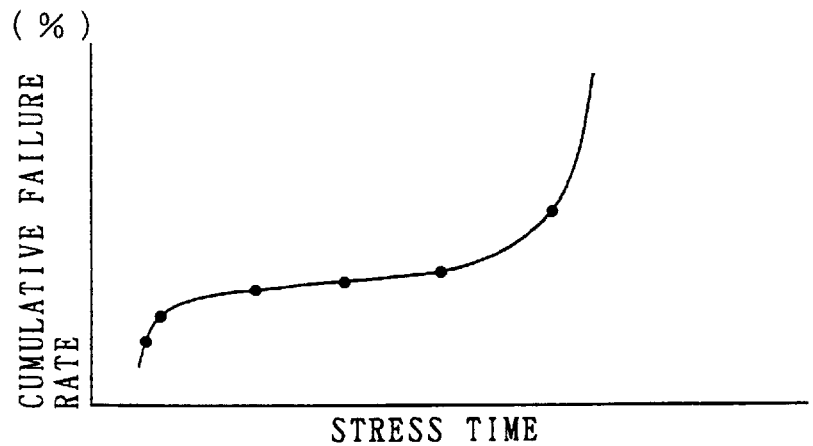
FIG. 43 is a graph showing an example of the results of the TDDB test.
Figure 44:
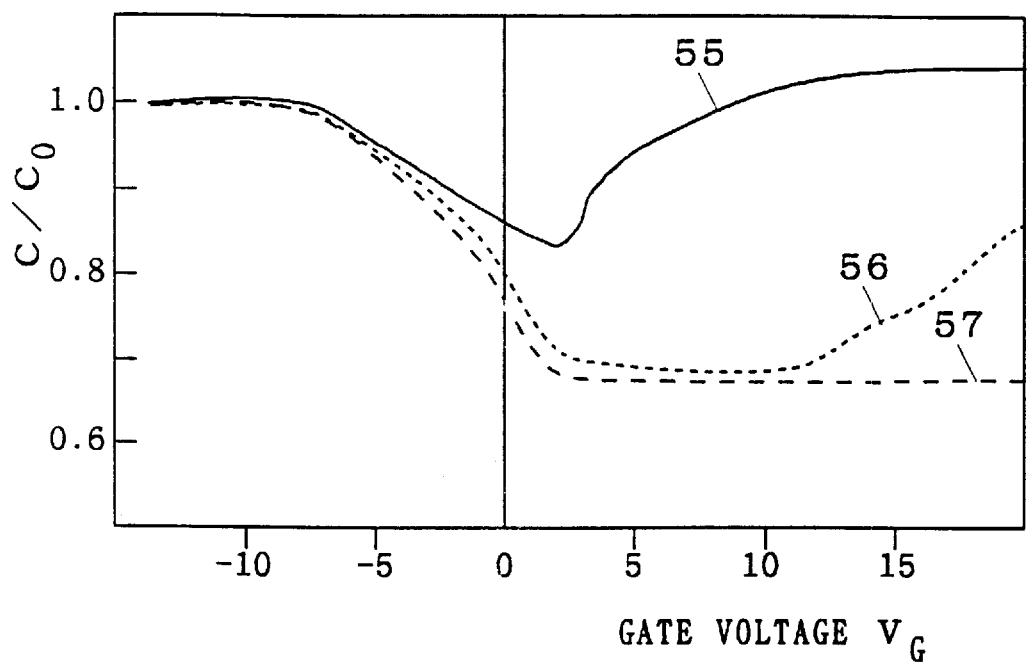
FIG. 44 is a graph showing an example of the results of the C-V characteristic test of an MOS capacitor.

FIG. 35 and FIG. 36 are diagrams showing the structure of a dielectric film evaluating test structure according to an eighteenth preferred embodiment of the present invention. FIG. 35 is a plan view of the dielectric film evaluating test structure of the eighteenth preferred embodiment and FIG. 36 is a sectional view taken along the line Z12—Z12 of FIG. 35. In FIG. 35 and FIG. 36, reference numeral $4a$ denotes a field oxide film formed between the plurality of dielectric films (gate insulator films 5), and other parts shown by the same reference characters as those in FIG. 33 or FIG. 34 are parts the same as or corresponding to those shown by the same reference characters in FIG. 33 or FIG. 34.

The dielectric film evaluating test structure shown in FIG. 35 and FIG. 36 is different from the dielectric film evaluating test structure shown in FIG. 33 and FIG. 34 in that the dielectric films (gate insulator films 5) are formed in the plurality of regions surrounded by the field oxide film 4. Accordingly, in the test structure shown in FIG. 35 and FIG. 36, the length of the overlap of the gate electrodes 6A and the boundaries between the dielectric films and the field oxide film 4 per one evaluating test structure for the dielectric film is longer than that in the dielectric film evaluating test structure shown in FIG. 33 and FIG. 34. Accordingly, the effects of the boundary between the field oxide film 4 and the gate insulator films 5 can be clarified, improving the accuracy in evaluating the effects of the boundary.

Other effects are the same as those of the dielectric film evaluating test structure shown in FIG. 33 and FIG. 34.

Although a plurality of gate electrodes 6A are provided in the preferred embodiments described above, it is needless to say that a single gate electrode 6A may be formed if sufficient evaluation is possible in relation to measuring accuracy.

FIG. 37 is a graph showing the results of the conventional TDDB test and the TDDB test according to the fourteenth preferred embodiment of the present invention. In FIG. 37, reference numeral 30 is a curve showing the evaluation results of this invention and 31 is a curve showing the conventional evaluation results. As can be seen from the diagram, the curve 30 is above the curve 31, where the accumulated failure rate is generally larger in this invention, which shows that use of the dielectric film evaluating test structure of the present invention provides results closer to those of an actual semiconductor device.

While the invention has been described in detail, the foregoing description is in all aspects illustrative and not restrictive. It is understood that numerous other modifications and variations can be devised without departing from the scope of the invention.

We claim:

1. A dielectric film evaluating test structure, comprising:
   a semiconductor substrate having one main surface and the other main surface;
   a field oxide formed on said one main surface of said semiconductor substrate to surround a plurality of first regions on said one main surface;
   a dielectric film formed in said at least one first region and having its end coupled with said field oxide; and
   at least one gate electrode formed over said plurality of first regions and including an electrode material formed on said dielectric film;
   wherein said at least one gate electrode has its shape determined by a plurality of openings formed on said dielectric film by etching said electrode material and a source, drain region is not formed under a part of said dielectric film exposed in the plurality of openings.

2. The dielectric film evaluating test structure according to claim 1, further comprising a well formed in said semiconductor substrate under said dielectric film,
   said well having a well contact for applying a desired voltage between said at least one gate electrode and said well.

3. The dielectric film evaluating test structure according to claim 2, further comprising a well formed in said semiconductor substrate under said dielectric film.

4. The dielectric film evaluating test structure according to claim 1, wherein said at least one gate electrode includes a plurality of elongated gate electrodes formed being separated by said plurality of openings on said dielectric film.

5. The dielectric film evaluating test structure according to claim 4, wherein said at least one first region includes a plurality of first regions, and said at least one gate electrode is formed over said plurality of first regions.

6. The dielectric film evaluating test structure according to claim 5, further comprising a well formed in said semiconductor substrate under said dielectric film,
   said well having a well contact for applying a desired voltage between said at least one gate electrode and said well.

7. The dielectric film evaluating test structure according to claim 6, further comprising a well formed in said semiconductor substrate under said dielectric film.

8. A dielectric film evaluating test structure, comprising:
   a semiconductor substrate having one main surface and the other main surface;
   a field oxide formed on said one main surface of said semiconductor substrate to surround a plurality of first regions on the one main surface;
   a dielectric film formed in said at least one first region and having its end coupled with said field oxide;
   a plurality of gate electrodes formed over said plurality of first regions and including an electrode material provided on said dielectric film and having its shape determined by a plurality of openings formed by etching the electrode material; and
   a source, drain region formed under a part of said dielectric film exposed in said plurality of openings by driving impurities through said dielectric film.

9. The dielectric film evaluating test structure according to claim 8, wherein said at least one first region includes a plurality of first regions, and
   said plurality of gate electrodes are formed over said plurality of first regions.

10. The dielectric film evaluating test structure according to claim 8, further comprising a well formed in said semiconductor substrate under said dielectric film,
    said well having a well contact for applying a desired voltage between said plurality of gate electrodes and said well.

11. The dielectric film evaluating test structure according to claim 10, wherein said at least one first region includes a plurality of first regions, and
    said plurality of gate electrodes are formed over said plurality of first regions.

12. The dielectric film evaluating test structure according to Claim 10, further comprising a well formed in said semiconductor substrate under said dielectric film.

13. The dielectric film evaluating test structure according to claim 8, further comprising a source, drain contact formed in said source, drain region for applying a certain voltage between said source, drain region and said semiconductor substrate.

14. The dielectric film evaluating test structure according to claim 13, further comprising a well formed in said semiconductor substrate under said dielectric film,
    said well having a well contact for applying a desired voltage between said plurality of gate electrodes and said well.

15. The dielectric film evaluating test structure according to claim 14, wherein said at least one first region includes a plurality of first regions, and
    said plurality of gate electrodes are formed over said plurality of first regions.

16. The dielectric film evaluating test structure according to claim 14, further comprising a well formed in said semiconductor substrate under said dielectric film.

17. The dielectric film evaluating test structure according to claim 8, wherein said source, drain region has no contact and has the same conductivity type as that of said semiconductor substrate.

18. The dielectric film evaluating test structure according to claim 17, wherein said at least one first region includes a plurality of first regions, and
    said plurality of gate electrodes are formed over said plurality of first regions.

* * * * *